United States Patent
Mileski et al.

(10) Patent No.: US 10,222,435 B2
(45) Date of Patent: Mar. 5, 2019

(54) MAGNETIC COIL POWER METHODS AND APPARATUS

(71) Applicant: Hyperfine Research, Inc., Guilford, CT (US)

(72) Inventors: William J. Mileski, Ledyard, CT (US); Gregory L. Charvat, Guilford, CT (US); Jonathan M. Rothberg, Guilford, CT (US); Jeremy Christopher Jordan, Cromwell, CT (US)

(73) Assignee: Hyperfine Research, Inc., Guilford, CT (US)

( * ) Notice: Subject to any disclaimer, the term of this patent is extended or adjusted under 35 U.S.C. 154(b) by 0 days.

(21) Appl. No.: 16/123,941

(22) Filed: Sep. 6, 2018

(65) Prior Publication Data
US 2019/0018095 A1 Jan. 17, 2019

Related U.S. Application Data

(62) Division of application No. 15/097,433, filed on Apr. 13, 2016.

(60) Provisional application No. 62/146,609, filed on Apr. 13, 2015.

(51) Int. Cl.
| | |
|---|---|
| *G01R 33/00* | (2006.01) |
| *G01R 33/385* | (2006.01) |
| *G05F 1/46* | (2006.01) |
| *G01R 33/46* | (2006.01) |
| *G01R 33/38* | (2006.01) |

(52) U.S. Cl.
CPC ......... *G01R 33/3852* (2013.01); *G01R 33/38* (2013.01); *G01R 33/46* (2013.01); *G05F 1/461* (2013.01); *G01R 33/3854* (2013.01)

(58) Field of Classification Search
CPC ..... G01R 33/3852; G01R 33/38; G01R 33/46
USPC .................................................. 324/307, 322
See application file for complete search history.

(56) References Cited

U.S. PATENT DOCUMENTS

| | | | |
|---|---|---|---|
| 4,737,716 | A | 4/1988 | Roemer et al. |
| 5,270,657 | A | 12/1993 | Wirth et al. |
| 6,031,746 | A | 2/2000 | Steigerwald et al. |
| 6,452,391 | B1 | 9/2002 | Bernstein et al. |
| 6,845,262 | B2 | 1/2005 | Albert et al. |

(Continued)

OTHER PUBLICATIONS

Invitation to Pay Additional Fees for International Application No. PCT/US2016/027215 dated Jun. 3, 2016.

(Continued)

*Primary Examiner* — Reena Aurora
(74) *Attorney, Agent, or Firm* — Wolf, Greenfield & Sacks, P.C.

(57) ABSTRACT

An apparatus to provide power for operating at least one gradient coil of a magnetic resonance imaging system. According to some aspects, the apparatus comprises a plurality of power terminals configured to supply different voltages of a first polarity, and a linear amplifier configured to provide at least one output to power the at least one gradient coil to produce a magnetic field in accordance with a pulse sequence, the linear amplifier configured to be powered by one or more of the plurality of power terminals, wherein the one or more of the plurality of power terminals powering the linear amplifier is selected based, at least in part, on the at least one output.

28 Claims, 21 Drawing Sheets

(56) References Cited

U.S. PATENT DOCUMENTS

| | | | |
|---|---|---|---|
| 9,322,890 B2* | 4/2016 | Xu | H02M 3/3376 |
| 9,389,288 B2* | 7/2016 | Sabate | G01R 33/3852 |
| 2004/0152969 A1 | 8/2004 | Zhang et al. | |
| 2013/0234704 A1 | 9/2013 | Hurlimann et al. | |
| 2015/0048826 A1 | 2/2015 | Hori et al. | |
| 2015/0137810 A1* | 5/2015 | Ham | G01R 33/3852 |
| | | | 324/309 |
| 2016/0299203 A1 | 10/2016 | Mileski et al. | |

OTHER PUBLICATIONS

International Search Report and Written Opinion for International Application No. PCT/US2016/027215 dated Aug. 26, 2016.

[No Author Listed] Electronics Tutorials: RC Waveforms and RC Step Response—The RC Differentiator. Apr. 30, 2010 [Retrieved Jul. 28, 2016]. http://www.electronics-tutorials/ws/rc/rc_3.html.

* cited by examiner

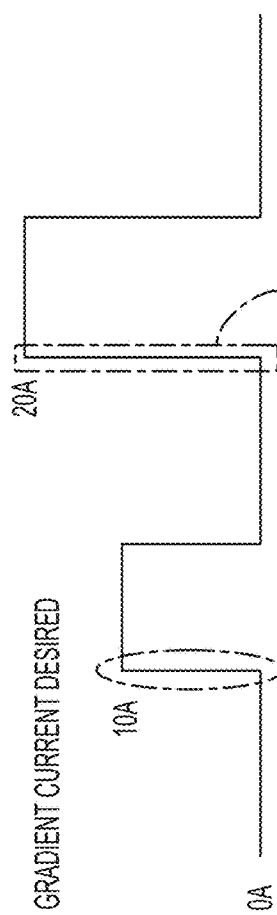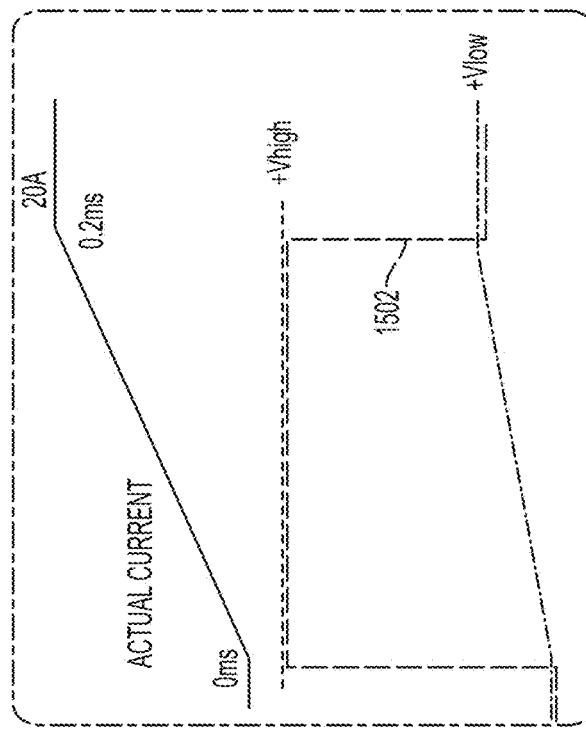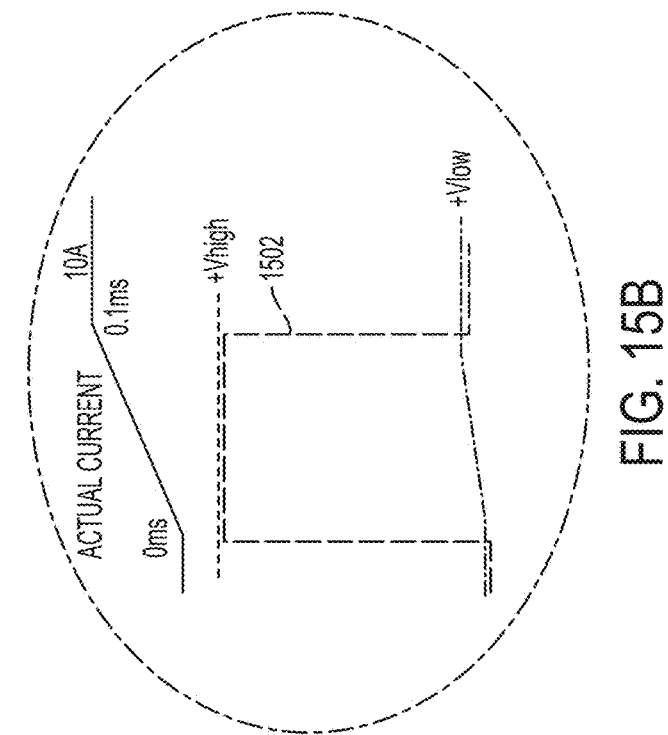

MAGNETIC COIL POWER METHODS AND APPARATUS

CROSS-REFERENCE TO RELATED APPLICATIONS

This Application claims the benefit under 35 U.S.C. § 120 and is a divisional of U.S. application Ser. No. 15/097,433, filed Apr. 13, 2016, titled MAGNETIC COIL POWER METHODS AND APPARATUS, which claims priority under 35 U.S.C. § 119 to U.S. Provisional Patent Application Ser. No. 62/146,609, filed Apr. 13, 2015, titled MAGNETIC COIL AMPLIFIER METHODS AND APPARATUS, each application of which is herein incorporated by reference in its entirety.

TECHNICAL FIELD

This disclosure relates generally to power components for magnetic coils and, more particularly, to power components for driving one or more gradient coils in a magnetic resonance imaging system.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is on the order of one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable, with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

SUMMARY

Some embodiments relate to an apparatus to provide power for operating at least one gradient coil of a magnetic resonance imaging system. The apparatus includes a plurality of power terminals configured to supply different voltages of a first polarity. The apparatus also includes a linear amplifier configured to provide a current to the at least one gradient coil to produce a magnetic field in accordance with a pulse sequence. The linear amplifier is configured to be powered by one or more of the plurality of power terminals. The one or more of the plurality of power terminals powering the linear amplifier can be changed to produce different linear amplifier output voltages.

Some embodiments include an apparatus to provide power for operating at least one gradient coil of a magnetic resonance imaging system, the apparatus comprising a plurality of power terminals configured to supply different voltages of a first polarity, and a linear amplifier configured to provide at least one output to drive the at least one gradient coil to produce a magnetic field in accordance with a pulse sequence, the linear amplifier configured to be powered by one or more of the plurality of power terminals, wherein the one or more of the plurality of power terminals powering the linear amplifier is selected based, at least in part, on the at least one output.

Some embodiments include a method of providing power to at least one gradient coil of a magnetic resonance imaging system using a linear amplifier configured to provide current to the at least one gradient coil to produce a magnetic field in accordance with a pulse sequence, the linear amplifier configured to be powered by one or more of a plurality of power terminals configured to supply different voltages of a first polarity, the method comprising powering the linear amplifier by at least a first power terminal of the plurality of power terminals when a magnitude of an output voltage produced by the linear amplifier is below a threshold to provide current to the at least one gradient coil, and powering the linear amplifier by at least a second power terminal of the plurality of power terminals when the magnitude of the output voltage produced by the linear amplifier is above the threshold to provide current to the at least one gradient coil.

Some embodiment include a magnetic resonance imaging system comprising a B0 magnet configured to produce a B0 magnetic field, at least one gradient coil, and at least one power component configured to provide power to operate the at least one gradient coil, the at least one power component comprising a plurality of power terminals configured to supply different voltages of a first polarity, and a linear amplifier configured to provide a current to the at least one gradient coil to produce a magnetic field in accordance with a pulse sequence, the linear amplifier configured to be powered by one or more of the plurality of power terminals, wherein the one or more of the plurality of power terminals powering the linear amplifier can be changed to produce different linear amplifier output voltages.

Some embodiment include a magnetic resonance imaging system comprising a B0 magnet configured to produce a B0 magnetic field, at least one gradient coil, and at least one power component configured to provide power to operate the at least one gradient coil, the at least one power component comprising a plurality of power terminals configured to supply different voltages of a first polarity, and a linear amplifier configured to provide a current to the at least one gradient coil to produce a magnetic field in accordance with a pulse sequence, the linear amplifier configured to be powered by one or more of the plurality of power terminals, wherein the one or more of the plurality of power terminals powering the linear amplifier is selected based, at least in part, on the at least one output.

Some embodiments include an apparatus for providing power to operate at least one gradient coil of a magnetic resonance imaging system, the apparatus comprising a linear amplifier configured to produce an output that drives the at least one gradient coil in accordance with a pulse sequence, at least one power converter configured to produce a variable power supply voltage to power the linear amplifier, and at least one controller configured to control the at least one power converter to change the variable power supply voltage based upon an output of the linear amplifier.

Some embodiments include a method of providing power to at least one gradient coil of a magnetic resonance imaging system using a linear amplifier configured to provide current to the at least one gradient coil to produce a magnetic field in accordance with a pulse sequence, the method comprising converting at least one fixed power supply to at least one variable power supply voltage to power the linear amplifier, changing the variable power supply voltage based upon an output of the linear amplifier, and controlling the linear amplifier to produce an output that drives the at least one gradient coil in accordance with the pulse sequence.

Some embodiments include a magnetic resonance imaging system comprising a B0 magnet configured to produce a B0 magnetic field, at least one gradient coil, and at least one power component configured to provide power to operate the at least one gradient coil, the at least one power component comprising a linear amplifier configured to produce an output that drives the at least one gradient coil in accordance with a pulse sequence, at least one power converter configured to produce a variable power supply voltage to power the linear amplifier, and at least one controller configured to control the at least one power converter to change the variable power supply voltage based upon an output of the linear amplifier.

Some embodiments include an apparatus for driving at least one gradient coil of a magnetic resonance imaging system, the apparatus comprising a switching power converter configured to switch at a switching frequency above a Larmor frequency associated with a B0 field strength of the magnetic resonance imaging system, and a controller configured to control the switching power converter to drive the at least one gradient coil in accordance with a pulse sequence.

Some embodiments relate to a method of operating an apparatus for driving at least one gradient coil of a magnetic resonance imaging system according to the techniques described herein.

Some embodiments relate to at least one non-transistory computer readable storage medium having stored thereon instructions, which, when executed by a processor, perform such a method.

The foregoing summary is provided by way of illustration and is not intended to be limiting.

BRIEF DESCRIPTION OF DRAWINGS

Various aspects and embodiments of the disclosed technology will be described with reference to the following figures. It should be appreciated that the figures are not necessarily drawn to scale. Items appearing in multiple figures are indicated by the same reference number in all the figures in which they appear.

FIGS. 15A-15D show a gradient coil current waveform, gradient coil voltage waveform, and power supply terminal voltage waveforms, according to some embodiments.

DETAILED DESCRIPTION

Figure 1:
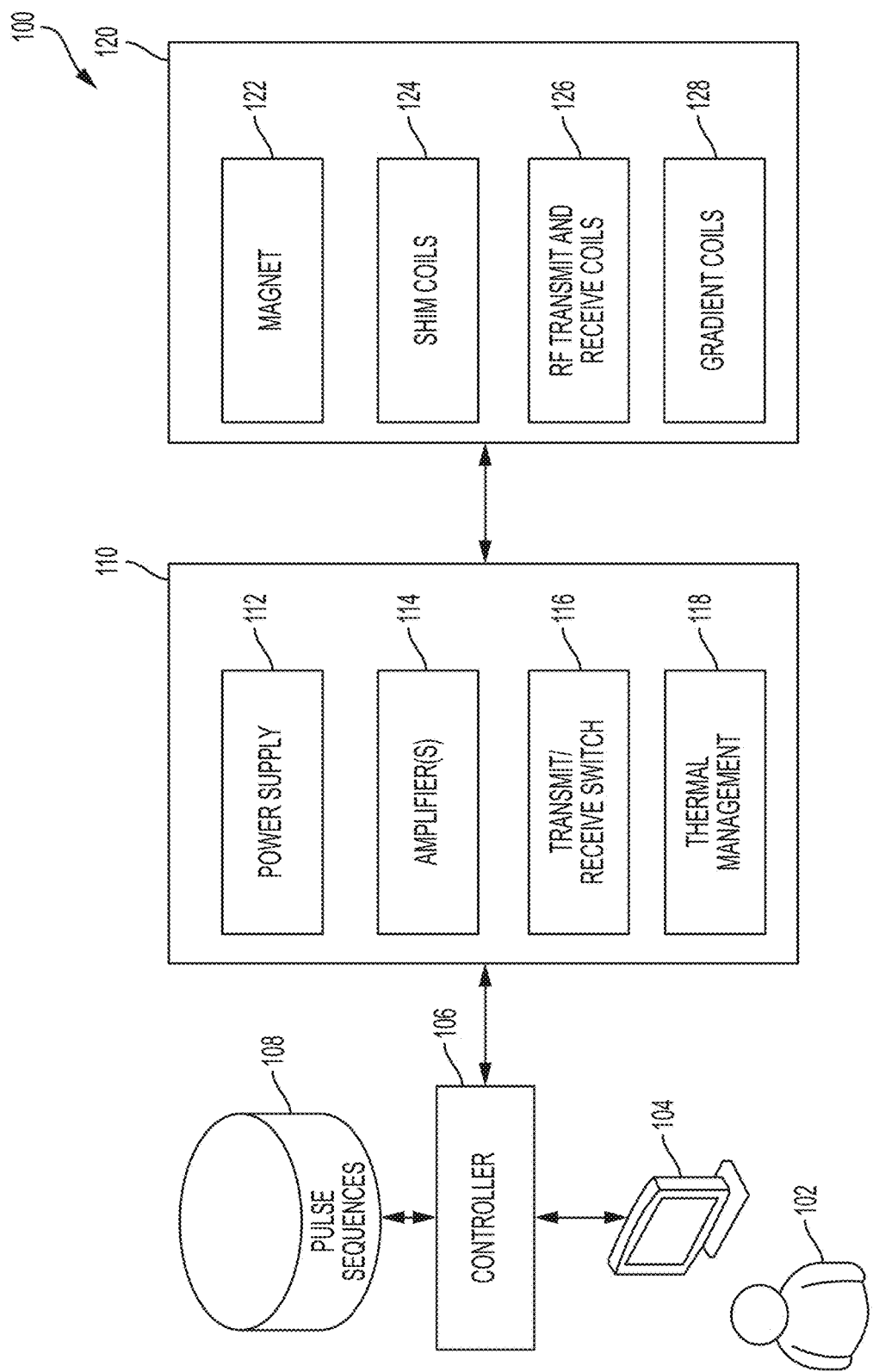
FIG. 1 is a block diagram of exemplary components of a low-field MRI system, in accordance with some embodiments of the technology described herein.

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a B0 field) at or above 1.5 T, though clinical systems operating between 0.5 T and 1.5 T are often also characterized as "high-field." By contrast, "low-field" refers generally to MRI systems operating with a B0 field of less than or equal to approximately 0.2 T, though systems having a B0 field of between 0.2 T and approximately 0.3 T have sometimes been characterized as low-field.

Low-field MRI presents an attractive imaging solution, providing a relatively low cost, high availability alternative to high-field MRI. In particular, low-field MRI systems can be implemented as self-contained systems that are deployable in a wide variety of clinical settings where high-field MRI systems cannot due to cost, size and/or the need for a specialized facility. However, due to the lower field strengths, low-field MRI systems generally also have relatively low signal-to-noise ratio. As such, the design of low noise components may play a significant role in the development of low-field MRI systems.

Aspects of the technical developments described herein are derived from the inventors' recognition of a need to provide relatively low noise and efficient power to one or more magnetic coils of an MRI system, particularly (though not limited to) low-field MRI systems where noise in the power source may be especially problematic. In this respect, the inventors have developed power components to drive magnetic coil(s) suitable for relatively low noise operation. Additionally, the inventors have recognized that conventional power sources are often powered by a single relatively high voltage power terminal during intervals when such a voltage is not necessary to operate the corresponding component and, in this respect, such solutions are relatively inefficient. The inventors have developed power components with generally improved efficiency by, according to some embodiments, providing a plurality of power terminals that can be switched in to power an amplifier in desired combinations, each configured to supply a different voltage level to power the amplifier. In this manner, intervals where the amplifier is drawing substantially more power than needed may be reduced.

Briefly, MRI involves placing a subject to be imaged (e.g., all or a portion of a patient) in a static, homogenous magnetic field $B_0$ to align a subject's atomic net magnetization (often represented by a net magnetization vector) in the direction of the $B_0$ field. One or more transmit coils are then used to generate a pulsed magnetic field $B_1$ having a frequency related to the rate of precession of atomic spins of the atoms in the magnetic field $B_0$ to cause the net magnetization of the atoms to develop a component in a direction transverse to the direction of the $B_0$ field. After the $B_1$ field is turned off, the transverse component of the net magnetization vector precesses, its magnitude decaying over time until the net magnetization re-aligns with the direction of the $B_0$ field. This process produces MR signals that can be detected, for example, by voltages induced in one or more receive coils of the MRI system.

In addition, MRI involves using gradient coils to induce gradients in the main magnetic field $B_0$ so that the MR signal emanating from particular spatial locations within the subject may be identified (i.e., gradient coils are used to spatially encode detected MR signals). An MR image is formed in part by pulsing the transmit coil(s) and/or the gradient coils in a particular sequence, referred to as a "pulse sequence," and using the receive coil(s) to sense MR signals induced by the pulse sequence. The detected MR signals may then be processed (e.g., "reconstructed") to form an image. A pulse sequence generally describes the order and timing in which transmit/receive coils and gradient coils operate to prepare the magnetization of the subject and acquire resulting MR data. For example, a pulse sequence may indicate an order of transmit pulses, gradient pulses, and acquisition times during which the receive coils acquire MR data.

To produce pulse sequences for MRI, power components are generally provided to drive magnetics components to produce magnetic fields in accordance with the prescribed pulse sequence. There are a number of considerations in the low-field context that make conventional high-field power solutions undesirable and/or unsuitable for low-field MRI. For example, while the cost of conventional high-field power components may be acceptable given the relative insignificance compared to the total cost of a high-field MRI installation, this cost may be unacceptably high in the context of a low-field MRI system that is designed as a lower cost alternative. Thus, the cost of a power component conventionally used for high-field MRI may be disproportionately large and therefore not satisfactory for some lower cost low-field MRI systems.

Additionally, a challenge in low-field MRI is the relatively low signal-to-noise ratio. In particular, the signal-to-noise ratio of an MR signal is related to the strength of the main magnetic field B0, and is one of the factors driving clinical systems to operate in the high-field regime. Thus, the MR signal strength is relatively weak in the low-field context due to the low field strengths so that any additional noise in the system may have a relatively significant impact on image quality. In this respect, the inventors have recognized that conventional power components for driving coils of a high-field MRI system may be unsuitable for low-field MRI system because they are not designed to drive the coils with sufficiently low noise. Although the noise injected by such power components may be acceptable in the high SNR regime of high-field MRI systems, such components generally do not provide a sufficiently low level of noise to provide acceptable image quality in a low-field MRI system. For example, conventional power components may exhibit unsatisfactory variation in the output (e.g., ripple) for use in the low-field context, injecting relatively significant noise into the gradient coil system of a low-field MRI system.

The inventors have developed low-noise power component(s) suitable for driving one or more magnetics components (e.g., coils) of a low-field MRI system and, according to some embodiments, have developed relatively low-noise power component(s) implemented using a relatively high efficiency linear amplifier design, some examples of which are described in further detail below. While the low-noise power components described herein are suitable for low-field MRI, they are not limited for use with low-field MRI systems and may be used with any suitable MRI system.

It should be appreciated that the embodiments described herein may be implemented in any of numerous ways. Examples of specific implementations are provided below for illustrative purposes only. It should be appreciated that the embodiments and the features/capabilities provided may be used individually, all together, or in any combination of two or more, as aspects of the technology described herein are not limited in this respect.

FIG. 1 is a block diagram of exemplary components of a MRI system 100 (e.g., a low-field MRI system). In the illustrative example of FIG. 1, MRI system 100 comprises computing device 104, controller 106, pulse sequences store 108, power management system 110, and magnetics components 120. It should be appreciated that system 100 is illustrative and that a MRI system may have one or more other components of any suitable type in addition to or instead of the components illustrated in FIG. 1.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field (e.g., any one or combination of electromagnet(s), printed magnetics, permanent magnet(s), etc.). Thus, a $B_0$ magnet refers herein to any one or combination of magnetics components of any type configured to produce a $B_0$ field. According to some embodiments, $B_0$ magnet 122 may produce or contribute to a B0 field greater than or equal to approximately 20 mT and less than or equal to approximately 50 mT, greater than or equal to approximately 50 mT and less than or equal to approximately 0.1 T, greater than or equal to approximately 0.1 T and less than or equal to approximately 0.2 T, greater than or equal to approximately 0.2 T and less than or equal to approximately 0.3 T, greater than 0.3 T and less than or equal to approximately 0.5 T, etc. Shim coils 124 may be used to contribute magnetic field(s) to improve the homogeneity of the $B_0$ field generated by magnet 122.

Gradient coils 128 may be arranged to provide gradient fields and, for example, may be arranged to generate gradients in the B0 field in three substantially orthogonal directions (X, Y, Z). Gradient coils 128 may be configured to encode emitted MR signals by systematically varying the B0 field (the B0 field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. For example, a first gradient coil may be configured to selectively vary the B0 field in a first (X) direction to perform frequency encoding in that direction, a second gradient coil may be configured to selectively vary the B0 field in a second (Y) direction substantially orthogonal to the first direction to perform phase encoding, and a third gradient coil may be configured to selectively vary the B0 field in a third (Z) direction substantially orthogonal to the first and second directions to enable slice selection for volumetric imaging applications.

As discussed above, MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses. For example, the transmit coil(s) may be configured to generate any of the pulse sequences described in U.S. patent application Ser. No. 14/938,430 ('430 application), titled "Pulse Sequences for Low Field Magnetic Resonance," filed Nov. 11, 2015, which is herein incorporated by reference in its entirety.

Each of magnetics components 120 may be constructed in any suitable way. For example, in some embodiments, one or more (e.g., all) of magnetics components 120 may be fabricated, constructed or manufactured using techniques described in U.S. patent application Ser. No. 14/845,652 ('652 application), titled "Low-field Magnetic Resonance Imaging Methods and Apparatus," and filed Sep. 4, 2015, which is herein incorporated by reference in its entirety. However, the techniques described herein are not limited in this respect, as any suitable technique may be used to provide the magnetics components 120.

Power management system 110 includes electronics to provide operating power to one or more components of the low-field MRI system 100. For example, as discussed in more detail below, power management system 110 may include one or more power supplies, gradient power components, transmit coil components, and/or any other suitable power electronics needed to provide suitable operating power to energize and operate components of the low-field MRI system 100.

As illustrated in FIG. 1, power management system 110 comprises power supply 112, power component(s) 114, transmit/receive switch 116, and thermal management components 118. Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. In some embodiments, power supply 112 is a unipolar, continuous wave (CW) power supply, however, any suitable power supply may be used. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

Thermal management components 118 provide cooling for components of low-field MRI system 100 and may be configured to do so by facilitating the transfer of thermal energy generated by one or more components of the low-field MRI system 100 away from those components. Thermal management components 118 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 118 may include any suitable heat transfer medium including, but not limited to, air and liquid coolant (e.g., water), to transfer heat away from components of the low-field MRI system 100.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence. For example, for embodiments wherein MRI system 100 operates at low-fields, controller 106 may be configured to control power management system 110 to operate the magnetic components 120 in accordance with a zero echo time (ZTE) pulse sequence, a balanced steady-state free precession pulse sequence (LF-bSSFP), a gradient echo pulse sequence, a spin echo pulse sequence, an inversion recovery pulse sequence, arterial spin labeling, diffusion weighted imaging (DWI), and/or any other pulse sequence specified for operation in the low-field context. Pulse sequences for low-field MRI may be applied for different contrast types such as T1-weighted and T2-weighted imaging, diffusion-weighted imaging, arterial spin labeling (perfusion imaging), Overhauser imaging, etc. However, any pulse sequence may be used, as the aspects are not limited in this respect. Controller 106 may be implemented as hardware, software, or any suitable combination of hardware and software, as aspects of the disclosure provided herein are not limited in this respect.

In some embodiments, controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit and receive coils 126, parameters for operating gradient coils 128, etc.), one or more parameters for operating power management system 110 in accordance with the pulse sequence, one or more programs comprising instructions that, when executed by controller 106, cause controller 106 to control system 100 to operate in accordance with the pulse sequence, and/or any other suitable information. Information stored in pulse sequences repository 108 may be stored on one or more non-transitory storage media.

As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Computing device 104 may be any electronic device that may process acquired MR data and generate one or more images of the subject being imaged. In some embodiments, computing device 104 may be a fixed electronic device such as a desktop computer, a server, a rack-mounted computer, a workstation, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect. A user 102 may interact with computing device 104 to control aspects of the low-field MR system 100 (e.g., program the system 100 to operate in accordance with a particular pulse sequence, adjust one or more parameters of the system 100, etc.) and/or view images obtained by the low-field MR system 100.

As discussed above, the inventors have recognized that conventional power components for driving coils of a high-field MRI system are generally unsuitable for low-field MRI systems because they are not designed to drive the coils with low noise. Although the noise injected by such power components may be acceptable in high-field MRI systems having a high SNR, such power components do not provide a sufficiently low level of noise to provide acceptable image quality in a low-field MRI system. The low SNR of low-field MRI increases the need for low-noise power components to drive one or more coils of a low-field MRI system. The design of low-noise power component(s) can improve the SNR of a low-field MRI system.

Some high-field MRI systems use power components having a switching power converter to drive current through the coils. Although switching power converters can provide high efficiency, the inventors have recognized and appreciated that conventional switching converters can introduce a significant amount of switching noise into the system because they switch at frequencies in a range (e.g., in a range of tens to hundreds of kHz) that can impact the transmission of pulse sequences and the detection of MR signals emitted in response to the pulse sequences. For example, the switching frequencies and/or their harmonics of conventional switched power converters may overlap with the frequencies to which the transmit and/or receive coils are tuned to resonate and therefore add noise to the transmit/receive channels of the low-field MRI system. Although the noise injected by such power converters may not be significant in a high-field MRI system, the level of noise injected may be unacceptable in a low-field MRI system, and may degrade imaging quality. Additionally, the difference in the transmit/receive frequencies in high-field MRI typically allow for switching noise to be filtered out more easily as the switching noise typically will be out of band with respect to the transmit/receive frequencies (the switching frequencies and/or harmonics are much lower than the B1 frequency (transmit frequency), and therefore much easier to filter-out).

An alternative to using a switching power converter is to use a linear amplifier. As opposed to a switching power converter that switches its transistors between the fully-on and fully-off states, a linear amplifier operates its transistors over a continuous range to produce an amplified output. In a linear amplifier, a control signal may be provided to the control terminal (e.g., gate or base) of one or more transistors, and the current that flows through the transistor(s) is controlled based on the magnitude of the control signal. Since linear amplifiers produce their outputs by varying the currents of the transistors over a continuous range, as opposed to switching the transistors on and off at a switching frequency, the injection of switching noise can be avoided.

The inventors have appreciated, however, that a wide range of output currents and/or voltages may need to be provided to coils of an MRI system, such as the gradient coils, for example, so that using a single positive voltage terminal to provide positive output voltages and a single negative voltage terminal to provide negative output voltages results in an inefficient power component. In particular, a linear amplifier may dissipate significant power when producing output voltages of relatively low magnitude. For example, providing a relatively low voltage and high current at the output of the linear amplifier may require dropping a large voltage across the amplifier's transistor(s) between the supply voltage terminal and the amplifier's output terminal. Accordingly, such a linear amplifier may be inefficient when operated to produce low output voltages, and, as a consequence, may consume significant power and create significant heat dissipation. Although cooling systems may be used to cool the system, providing significant cooling capability for the amplifier circuitry may not be acceptable for some MRI systems, for example, low-field MRI systems designed to be of relatively small size, low weight and/or a low cost.

The inventors have recognized that the efficiency of a power component utilizing a linear amplifier may be improved by powering the amplifier from different supply voltages (e.g., multiple supply rails at different fixed voltages) based upon the output voltage produced by the amplifier. By providing the capability of connecting the amplifier to different supply voltages, an appropriate supply voltage can be selected that is closer to the amplifier's output voltage, which can reduce the voltage drop across the transistor(s) of the amplifier. Accordingly, the efficiency of the amplifier can be increased, and requirements to cool the amplifier can be significantly reduced or eliminated. Such an amplifier may be particularly advantageous in low-field MRI systems, which, as discussed above, can benefit from efficient, low-noise power components.

Figure 2:
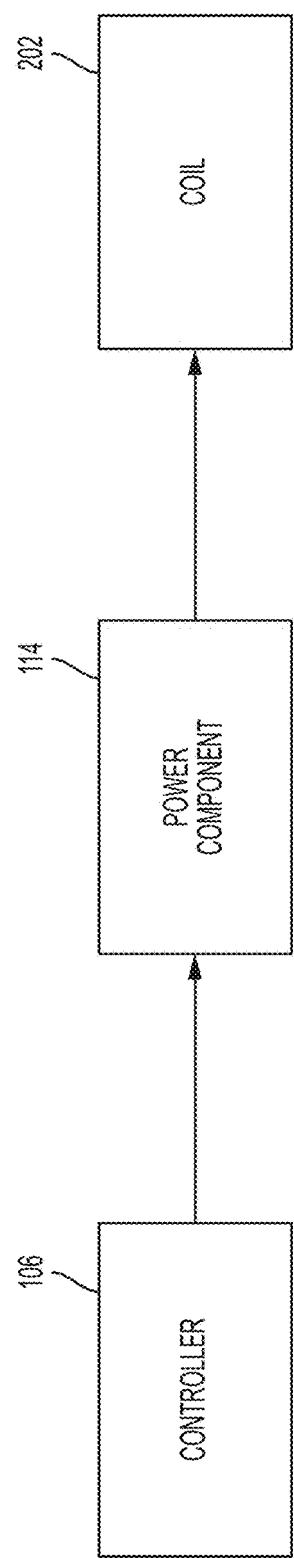
FIG. 2 shows drive circuitry for driving a current through a coil to produce a magnetic field, in accordance with some embodiments of the technology described herein.

FIG. 2 illustrates drive circuitry for driving a current through a coil 202 of an MRI system to produce a magnetic field in accordance with a desired pulse sequence, according to some embodiments. Power component 114 drives a current through coil 202 based on a control signal from the controller 106. The controller 106 may produce a control signal to drive power component 114 based on a pulse sequence implemented by controller 106 (or provided by one or more other controllers), as discussed above. In some embodiments, coil 202 may be a gradient coil 128. However, the techniques described herein are not limited in this respect, as coil 202 may be a coil of magnet 122, shim coil 124, or an RF transmit and/or receive coil 126.

Power components configured to power gradient coils typically provide relatively high power and typically need to provide precise control over the current provided to the gradient coil so that the desired pulse sequence can be delivered faithfully. Inaccuracies in delivering the commanded current to the gradient coil results in a decrease in signal-to-noise ratio due to differences between the gradient pulse sequence being delivered and the intended (and expected) pulse sequence. Power components configured to drive gradient coils also should to be responsive in delivering the commanded current to the gradient coil, including rapid transition between commanded current levels so as to faithfully produce the current waveforms required by the desired pulse sequences. Accordingly, the inventors have developed power components capable of being controlled to accurately and precisely provide current, with relatively low noise and relatively high efficiency, to one or more gradient coils to faithfully reproduce a desired pulse sequence, some embodiments of which are discussed in further detail below.

In some embodiments, the power component 114 may be a "current mode" power component that drives a desired current through coil 202. The desired current may be produced by power component 114 in response to a current command from controller 106. In this respect, the power component 114 may operate as a current source that is controlled by the current command (which may be provided by the controller as a voltage level indicating the current to be provided to coil 202). Controller 106 may change the current command such that power component 114 produces current values that change in accordance with a selected pulse sequence. For example, controller 106 may command the power component to drive one or more gradient coils in accordance with a pulse sequence comprising a plurality of gradient pulses. For each gradient pulse, the power component may need to ramp up the current provided to a corresponding gradient coil at the rising edge of the gradient pulse and ramp down the current provided to the gradient coil at a falling edge of the gradient pulse. Example operation of a power component configured to drive the gradient coil to provide a plurality of such gradient pulses is described in further detail below.

Figure 3A:
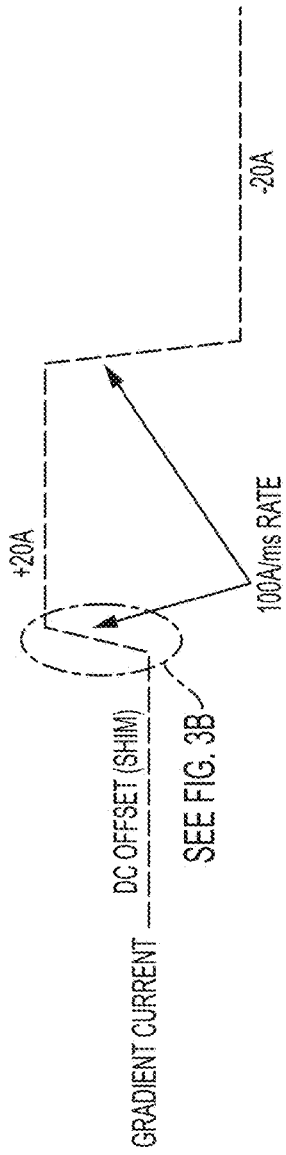
FIG. 3A shows an example of a gradient coil current waveform, in accordance with some embodiments of the technology described herein.

FIG. 3A shows an example of a gradient coil current waveform, according to some embodiments. In this example, the gradient coil current rapidly ramps up at the rising edge of the gradient pulse from 0 A to +20 A within a time interval of 0.2 ms, remains at +20 A for a period of time, then rapidly ramps down at the falling edge of the gradient pulse to −20 A, and remains at −20 A for a period of time. It should be appreciated that the exemplary current to produce a gradient pulse is provided by way of illustration and that different pulse sequences may comprise gradient pulses having different current and/or voltage requirements. Controller 106 and power component 114 can be configured to drive one or more gradient coils according to any suitable pulse sequence.

Figure 3B:
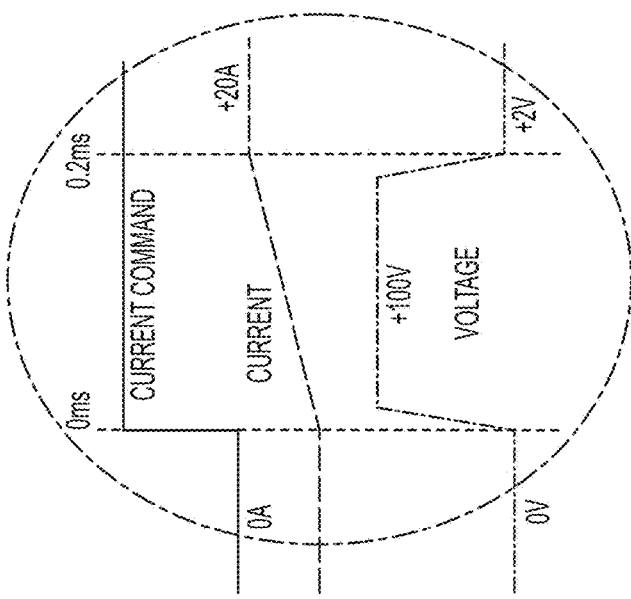
FIG. 3B shows waveforms for the current command, the gradient coil current and the gradient coil voltage before, during and after the rising transition of the gradient coil current waveform shown in FIG. 3A, in accordance with some embodiments of the technology described herein.

FIG. 3B shows waveforms for the current command, the gradient coil current and the gradient coil voltage before, during and after the rising edge of the gradient coil current shown in FIG. 3A. The gradient coil current is the current through the gradient coil. The gradient coil voltage is the voltage across the gradient coil. The current command is a signal representing an amount of current to be driven through the gradient coil by power component 114. In response to a current command at a time of 0 ms, the current through the gradient coil begins to rise toward the commanded current of +20 A. Since the gradient coil is an inductive load, a relatively large voltage needs to be provided to the gradient coil to rapidly increase the current through the gradient coil. Providing a rapid increase in current through the gradient coil is desirable in MRI applications, as providing fast transitions between gradient coil current values can decrease acquisition times and may be needed to implement certain pulse sequences. As should be appreciated from the exemplary voltages and currents shown in FIGS. 3A and 3B, the power component 114 may have the capability of driving the gradient coil with relatively high power.

As an example, a gradient coil may have an inductance of 200 µH and a resistance of 100 mΩ. Since the rate of change of the current through the gradient coil is proportional to its inductance, a voltage of 100V needs to be provided to the gradient coil to increase its current at a rate of 100 A/ms. However, once the gradient coil current levels off at 20 A, the voltage requirement drops substantially. At this point, since the current is no longer changing, the voltage needed depends upon the resistance of the gradient coil. Since the resistance of the gradient coil is 100 mΩ, the voltage needed to be provided to the gradient coil to maintain the current steady at 20 A is 2V, which is significantly lower than the voltage (100V) needed during the transition between current values. However, these values of current, voltage, inductance and resistance are provided merely by way of example, as any suitable gradient coil designs may be used, which may have different values of inductance and/or resistance. Further, other suitable values of currents, voltages, transition timings, etc. values may be used and/or needed to implement a given pulse sequence.

Since the resistance of the gradient coil may be relatively low (e.g., less than 500 mΩ), in some embodiments the power component 114 has a relatively low output impedance in order to efficiently supply the commanded current. For example, according to some embodiments, the power component 114 comprises a linear amplifier configured to power one or more gradient coils (e.g., to provide current to the one or more gradient coils in accordance with a desired pulse sequence). To implement a linear amplifier having a low output impedance, transistors of suitable size may be used having low equivalent series resistance and/or a number of transistors may be connected in parallel to produce a low resistance collectively. Interconnects may be designed to have a relatively low resistance. The output impedance of the linear amplifier may, for example, be less than twice the impedance of the gradient coil, in some embodiments. In some embodiments, the voltage drop across the transistors of the linear amplifier may be relatively low in operation, such as less than 5V, less than 2V, or less than 1V (and greater than 0V). Using an amplifier with a relatively low output impedance may be particularly helpful for driving current through a gradient coil, which may have substantial DC current. A low output impedance can improve efficiency and limit heating of the amplifier. Details of exemplary linear amplifier implementations are discussed in further detail below.

Figure 4A:
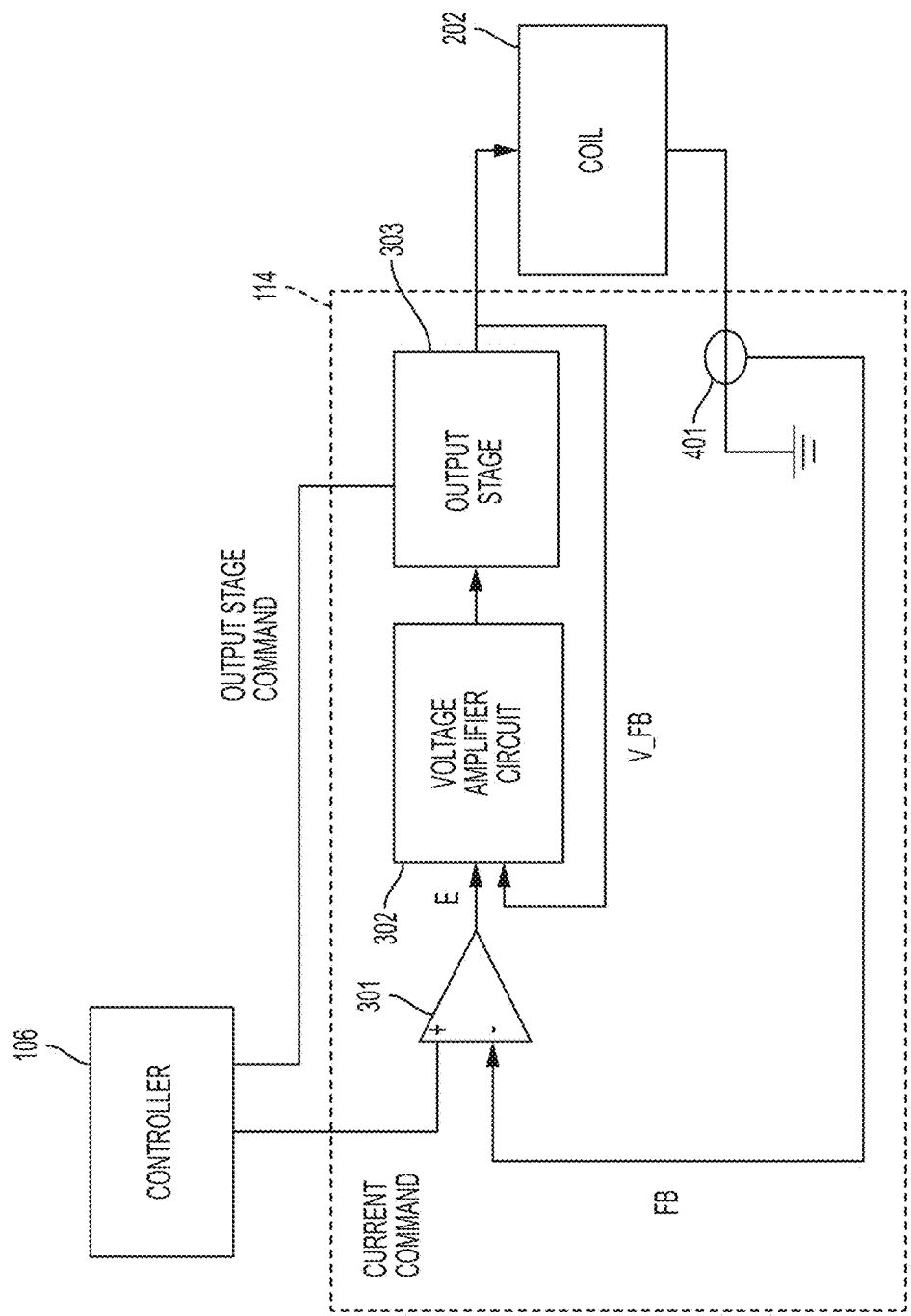
FIG. 4A shows an example of a power component having a current feedback loop and a voltage feedback loop, in accordance with some embodiments of the technology described herein.

FIG. 4A shows an example of a power component 114 having a current feedback loop and a voltage feedback loop, according to some embodiments. Power component 114 is configured to provide the current needed to drive one or more gradient coils in accordance with a desired pulse sequence. As such, power component 114 is designed to be a low noise current source that can be precisely controlled to provide the commanded current waveform needed to drive the one or more gradient coils to faithfully produce the desired gradient magnetic fields. Power component 114 includes a comparator 301 that receives a current command from controller 106 at its non-inverting input terminal and a current feedback signal FB from a current sensor 401 at its inverting input terminal. The current command may be a voltage value representing the commanded current. The current feedback signal FB may be a voltage value representing the measured current. In some embodiments, a high-quality current sensor may be used to provide an accurate feedback signal FB, which can improve the accuracy of the gradient coil current pulses.

The comparator 301 produces an error signal E (e.g., a voltage) representing the difference between the current command and the current feedback signal FB. Amplifier circuit 302 amplifies the error signal to produce an amplified error signal that is provided to the output stage 303. The output stage 303 drives coil 202 based upon the amplified error signal. The current through the coil 202 is measured by current sensor 401, and a feedback signal FB is fed back to the comparator 301, as discussed above. The current feedback loop thereby causes the current through the coil 202 to be equal to the current commanded by the controller 106. In this respect, the power component 114 may operate as a voltage-controlled current source. According to some embodiments, a high accuracy, high precision current sensor 401 is used to ensure that the current output provided to the gradient coil accurately tracks the current commanded by the controller 106. As a result, the current provided to power the gradient coil can be held as close to the commanded current as feasible. The power component 114 also has a voltage feedback loop that provides the output voltage of the output stage 303 to the input of the voltage amplifier circuit 302.

Figure 4B:
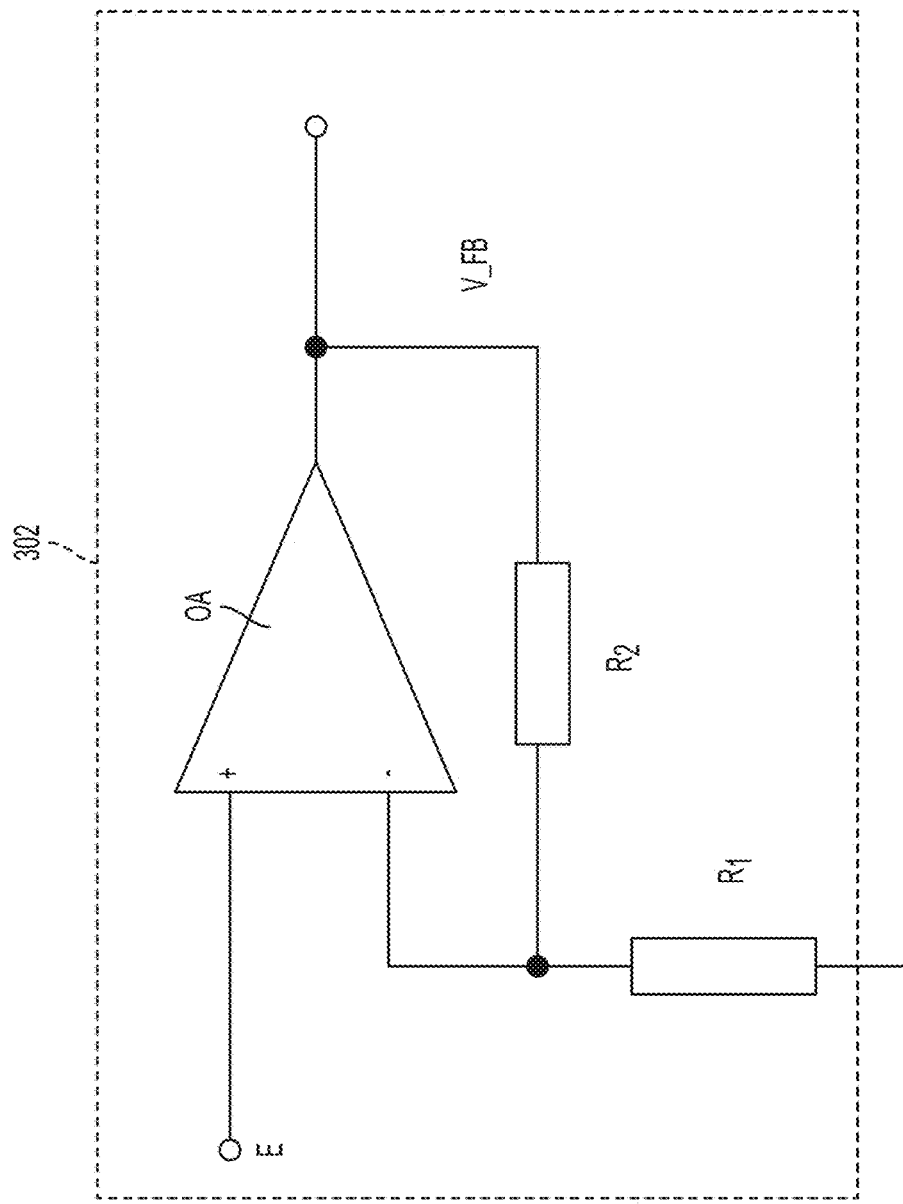
FIG. 4B shows an example of a voltage amplifier, in accordance with some embodiments of the technology described herein.

As illustrated in FIG. 4B, the voltage amplifier circuit 302 may include an operational amplifier 0 A that receives the error signal E at its non-inverting input and the voltage feedback signal V_FB at its inverting input. The voltage feedback signal may be provided to the inverting input of the operational amplifier through a resistive voltage divider (e.g., including resistors R1 and R2), which causes the operational amplifier to amplify the input voltage based on the ratio of resistance values in the voltage divider. Any suitable voltage gain may be used for the voltage amplifier, such a gain of 5-15, by way of example. In some embodiments, the voltage gain of the output stage may be one (unity).

As illustrated in FIG. 4A, in some embodiments, the controller 106 may provide a command to the output stage 303. The controller 106 may command the output stage 303 to produce a power supply voltage suitable for supplying current needed to perform a corresponding portion of a pulse sequence. As an example, the command may cause a power converter of the output stage to begin ramping up the magnitude of a power supply voltage in advance of a gradient coil current pulse. Such a command is discussed in further detail below with reference to FIG. 15D.

In some embodiments, the output stage 303 is configured to be selectively powered by a plurality of power supply terminals at different voltages. The power supply terminal selected to power the output stage 303 may be chosen depending on the output voltage produced by the voltage amplifier. For example, when the power component is commanded to produce a relatively high (positive) output voltage the power component may be powered from a relatively high (positive) voltage supply terminal, and when the power component is commanded to produce a relatively low (positive) output voltage, the power component is powered from a relatively low (positive) voltage supply terminal. Accordingly, the efficiency of the power component can be improved by reducing the voltage drop across its transistor(s) when relatively low output voltage is produced. It should be appreciated that any number of supply terminals and voltage levels may be used, as the aspects are not limited in this respect. For example, high, mid and low voltage supply terminals (both positive and negative) may be used, or an even greater number as suitable for a particular design and/or implementation.

Figure 5A:
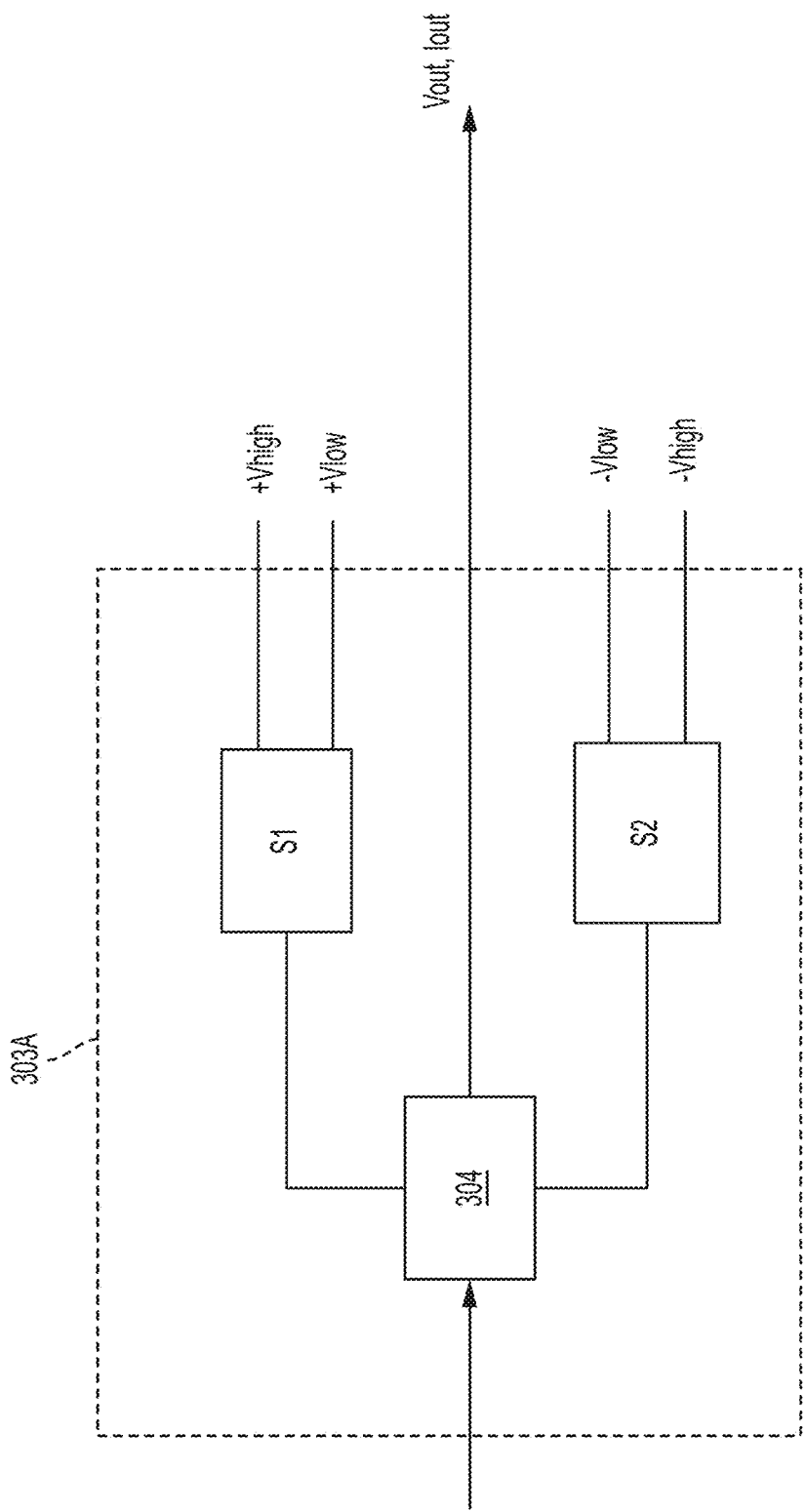
FIGS. 5A and 5B show examples of an output stage that can be powered by different supply terminals depending on the output voltage, in accordance with some embodiments of the technology described herein.

FIG. 5A shows an example of an output stage 303A having an output Vout, Iout suitable for powering one or more gradient coils of a magnetic resonance imaging system. To improve the power efficiency in powering one or more gradient coils, output stage 303A can be powered by different supply terminals depending on the output voltage Vout. For example, output stage 303A can be powered by a plurality of supply terminals of a first polarity (e.g., a plurality of different positive voltages) and/or a plurality of supply terminals of a second polarity (e.g., a plurality of different negative voltages). To facilitate low noise operation, according to some embodiments, output stage 303A may include a linear amplifier 304. According to some embodiment, each of the different supply terminals provides a different fixed supply voltage. According to some embodiments, one or more of the different supply terminals produce a variable supply voltage, as discussed in further detail below.

In operation, if a positive output voltage is produced at Vout, switching circuitry S1 connects the high side power input of linear amplifier 304 to either the high voltage terminal +Vhigh or the low voltage terminal +Vlow depending on the magnitude of the output voltage. If a relatively high output voltage is to be produced (e.g., if the output voltage to be produced exceeds a particular threshold), the switching circuitry S1 connects the high side power input of linear amplifier 304 to the high voltage terminal +Vhigh. If a relatively low output voltage is to be produced (e.g., if the output voltage to be produced remains below the particular threshold), the switching circuitry S1 connects the high side power input of linear amplifier 304 to the low voltage terminal +Vlow. Similarly, if a negative output voltage is produced, switching circuitry S2 connects the low side power input of linear amplifier 304 to either the high voltage terminal −Vhigh or the low voltage terminal −Vlow depending on the magnitude of the output voltage, as discussed above. Any suitable switching circuitry S1 and S2 may be used. Such switching circuitry may include a diode that is passively switched and/or a transistor that is actively switched.

Figure 5B:
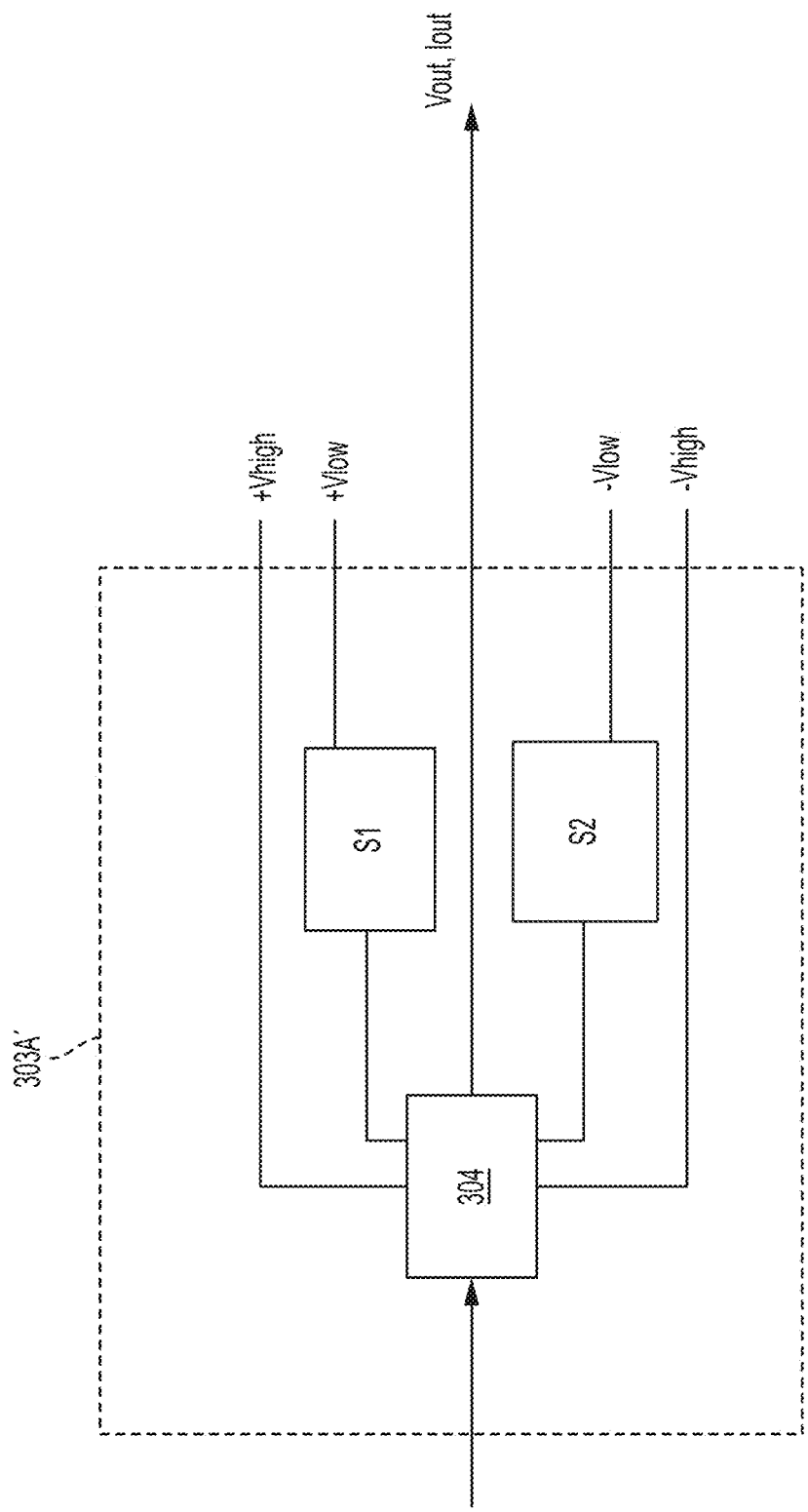

In some embodiments, the high-voltage or low-voltage terminals may be directly connected to the linear amplifier 304, without an intervening switch S1 or S2. For example, as shown by the exemplary output stage 303A' illustrated in FIG. 5B, the high voltage terminals +Vhigh and −Vhigh may be directly connected to the linear amplifier 304, and the low voltage terminals +Vlow and −Vlow may be connected to the linear amplifier 304 through respective switches S1 and S2. The linear amplifier 304 may be designed such that it is powered by a low voltage supply terminal unless its voltage is insufficient to supply the output current, in which case the linear amplifier 304 is powered by the high voltage supply terminal. It should be appreciated that the use of +−Vhigh and +−Vlow is merely exemplary and any number of voltages levels may be used to provide a desired output voltage. For example, one or more intervening voltage levels between +−Vhigh and +−Vlow, respectively, may be used to produce the desired voltage levels.

Figure 6:
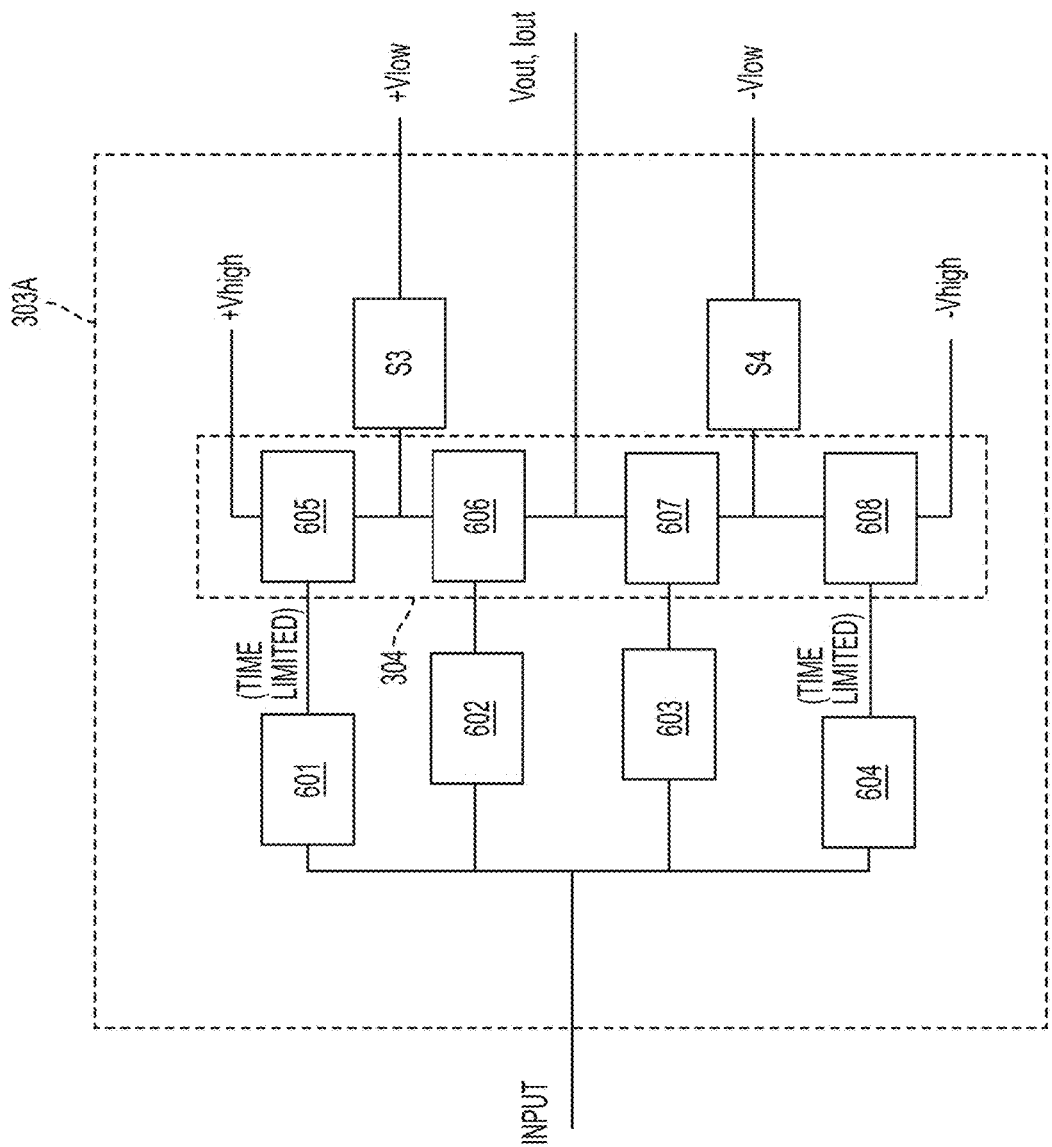
FIG. 6 shows an example of an output stage having a plurality of drive circuits to drive a plurality of transistor circuits connected to high voltage and low voltage supply terminals, in accordance with some embodiments of the technology described herein.

FIG. 6 shows an example of an output stage 303A having a plurality of drive circuits 601-604. Drive circuits 601-604 drive a linear amplifier 304 that includes a plurality of transistor circuits 605-608, each including one or more transistors. The linear amplifier 304 can be connected to the high voltage or low voltage supply terminals depending on the output voltage to be produced.

When a low positive output voltage is to be produced, transistor(s) 606 are connected to the low voltage terminal +Vlow via switch circuitry S3. Transistor(s) 605 are turned off by drive circuit 601 to isolate the transistors 606 from the high voltage terminal +Vhigh. Drive circuit 602 drives transistor(s) 606 as a linear amplifying element, based on the input, to produce an amplified output using the low voltage terminal +Vlow as a source of current.

To provide a high positive output voltage, drive circuit 601 turns on transistor(s) 605 to connect the high voltage terminal +Vhigh to the transistors 606. Switch circuitry S3 may be turned off to isolate transistor(s) 606 from the low voltage terminal +Vlow. Drive circuit 602 may drive transistor(s) 606 fully on, such that transistor(s) 605 are connected to the output of output stage 303A. Drive circuit 601 drives transistor(s) 605 as a linear amplifying element, based on the input, to produce an amplified output using the high voltage terminal +Vhigh.

Accordingly, the low voltage terminal +Vlow can be used to provide a low output voltage and the high voltage terminal +Vhigh can be used to provide a high output voltage. A negative output voltage may be provided similarly by drive circuits 603 and 604, transistor(s) 607 and 608, and switch circuitry S4. When a negative output voltage is produced, drive circuits 601 and 602 may turn off transistor(s) 605 and 606. Similarly, when a positive output voltage is produced, drive circuits 603 and 604 may turn off transistor(s) 607 and 608.

Transistor(s) 606 may operate as a linear amplifying element of linear amplifier 304 for low output voltages and transistor(s) 605 may operate as a linear amplifying element for high output voltages. In some embodiments, transistor(s) 606 and 605 may be biased such that for a transition region between low positive output voltages and high positive output voltages, transistor(s) 605 and 606 both act as linear amplifying elements of linear amplifier 304, i.e., they are neither fully-on nor fully-off. Operating both transistors 605 and 606 as linear elements during such transitions may facilitate linear amplifier 304 having a smooth and continuous transfer function. Transistors 607 and 608 may operate similarly to transistors 605 and 606 to produce a range of negative output voltages.

In some embodiments, switch circuitry S3 and S4 may be realized by diodes that automatically switch on an off depending on whether the high voltage terminal is being utilized. For example, if switch circuitry S3 includes a diode, the anode may be connected to the terminal +Vlow and the cathode to transistor(s) 606, such that current can only flow out of terminal +Vlow into the output stage 303A. However, the techniques described herein are not limited in this respect, as switch circuitry S3 and S4 may be realized using controlled switches, such as transistors, or any other suitable switching circuitry.

In some embodiments, the circuit of FIG. 6 may be used to drive a gradient coil using a pulse sequence as shown in FIG. 3. When the output current is constant, the output voltage (e.g., 2V) may be produced by sourcing current from the low voltage terminal +Vlow. During a transition when the current is changed rapidly, a high output voltage (e.g., 100V) may be produced by sourcing current from the high voltage terminal +Vhigh. Thus, the high voltage terminal may be used during transitions in the output current to provide high output voltages, and the low voltage terminal may be used to provide low output voltages for high efficiency.

According to some embodiments, for example, according to some pulse sequences, the high voltage terminal(s) may only need to be used for a relatively short period of time, so that transistor(s) 605 (and 608) may be conducting for only a relatively small duty cycle. Thus, in some embodiments, transistor(s) 605 (and 608) may be reduced in size, and/or the number of transistors connected in parallel may be reduced, with respect to transistors 606 (or 607), as transistor(s) 605 (and 608) will have time to dissipate heat between transitions in the gradient coil current.

In some embodiments, drive circuits 601 and 604 may be designed to provide time-limited output signals. Providing time-limited output signals may ensure that transistor(s) 605 and/or 608 are turned on only temporarily and not turned on to drive a steady state current. Such a technique may be advantageous if transistor(s) 605 or 608 are designed to conduct for only relatively short periods of time, as it can prevent excessive power dissipation by transistor(s) 605 or 608.

Figure 7:
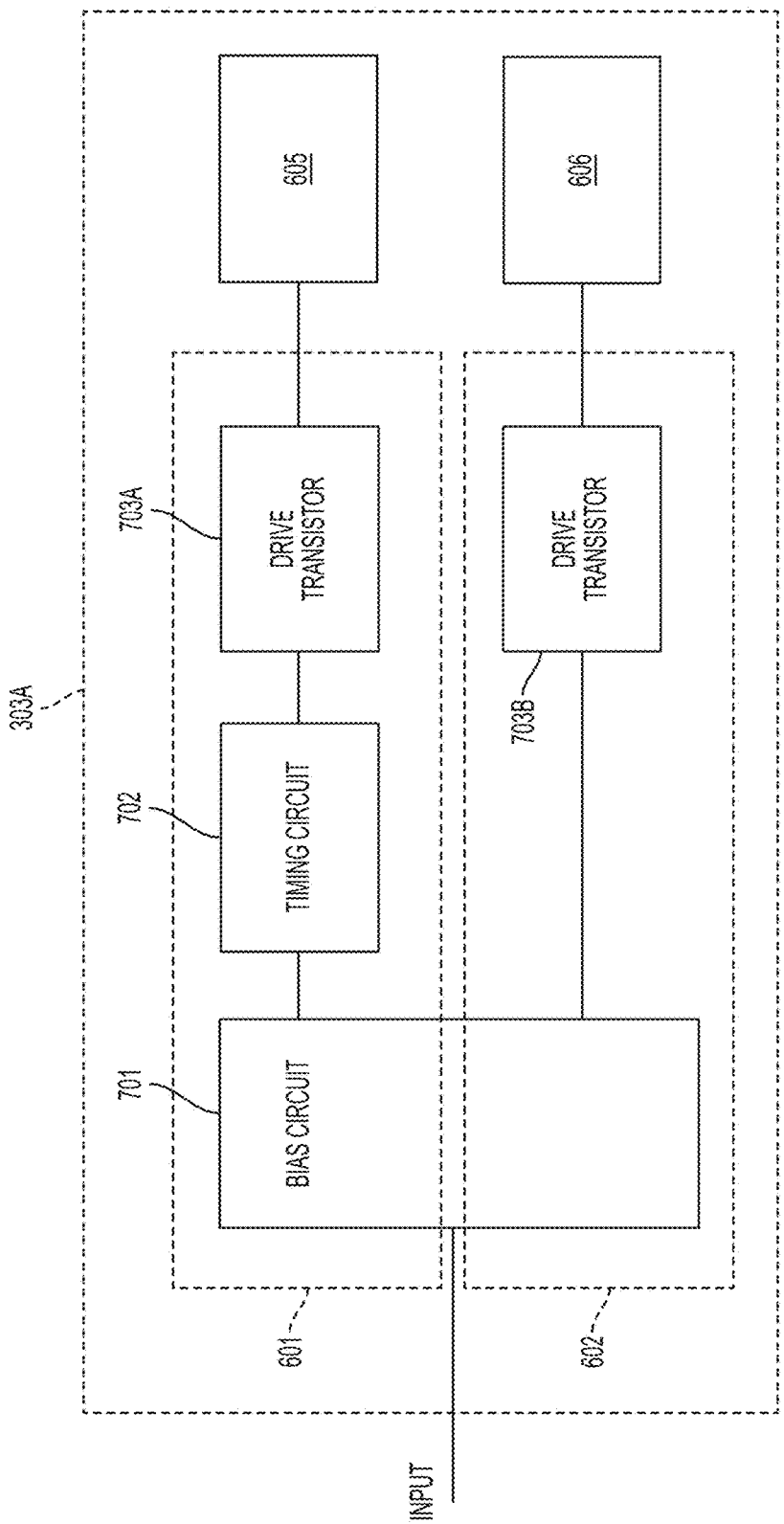
FIG. 7 shows drive circuits including a bias circuit and a timer circuit, in accordance with some embodiments of the technology described herein.

FIG. 7 shows a block diagram of drive circuitry 601 and 602, according to some embodiments. Drive circuitry 601 includes a drive transistor 703A for driving transistor(s) 605. Drive circuitry 602 includes a drive transistor 703B for driving transistor(s) 606.

Drive circuitry 601 and 602 may include one or more bias circuits 701 for producing a DC bias on the input voltage provided to the drive transistors 703A and 703B. In some embodiments, the bias circuit(s) 701 may bias drive transistors 703A and/or 703B slightly below their turn-on voltages. The inventors have recognized and appreciated that biasing the drive transistors slightly below their turn-on voltages can reduce or eliminate thermal runaway. Advantageously, such a biasing technique may not reduce the linearity of the output stage 303A. If an operational amplifier 0 A of voltage amplifier circuit 302 has a sufficiently high speed, it can respond fast enough to accurately control the output voltage of the output stage despite biasing the drive transistors slightly below their turn-on voltages.

In some embodiments, drive circuitry 601 may include a timing circuit that causes drive circuit 601 to produce a time-limited output. Any suitable timing circuit may be used. In the example of FIG. 7, a timing circuit 702 is connected to the input of output stage 303A via bias circuit 701, and limits the amount of time that an input can be provided to the drive transistor 703A.

In some embodiments, the timing circuit 702 may be an RC circuit that has an output voltage that decays over time, and turns off drive transistor 703A when the output of the timing circuit 702 falls below the turn on voltage of the drive transistor 703A. The time that transistor(s) 605 are turned on is limited based on the RC time constant of the RC circuit. However, the techniques described herein are not limited to implementing the timing circuit using an RC circuit, as any suitable timing circuitry may be used, including analog and/or digital circuitry. In some embodiments, drive circuits 603 and 604 may be implemented similarly to drive circuits 602 and 601, respectively, for negative input and output voltages.

Figure 8:
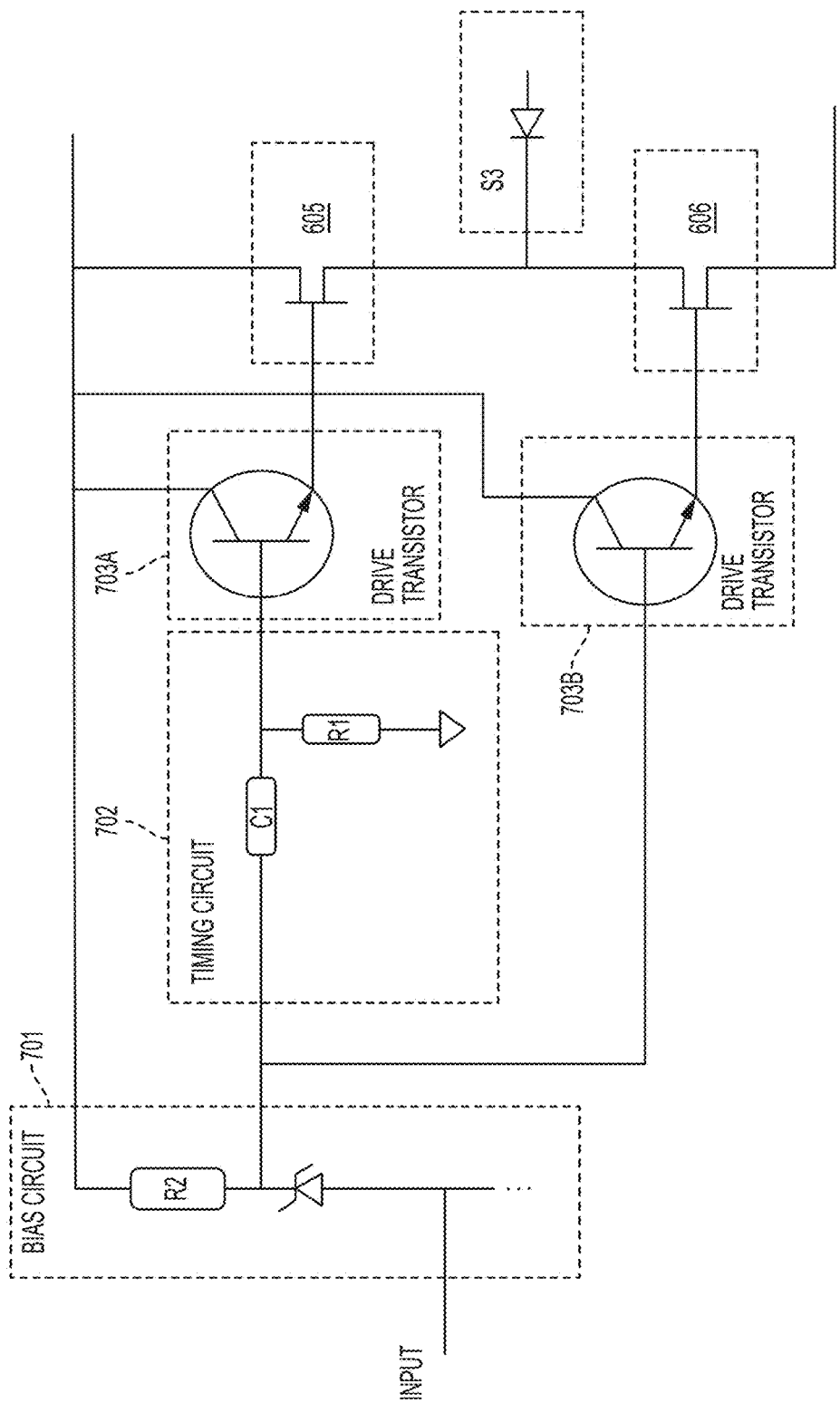
FIG. 8 shows an example implementation of the drive circuits of FIG. 7, in accordance with some embodiments of the technology described herein.

FIG. 8 shows an example implementation of the drive circuits of FIG. 7, in accordance with some embodiments of the technology described herein. As shown in FIG. 8, in some embodiments, the bias circuit 701 may be realized by a Zener diode in series with a resistor R2, connected between the high voltage terminal +Vhigh and a lower voltage DC terminal (e.g., −Vhigh) below the voltage of +Vhigh. In some embodiments, the bias circuit 701 may include additional circuitry between the high voltage terminal +Vhigh and the lower voltage DC terminal to provide a DC path for current to flow between them and establish a suitable bias voltage. In some embodiments, the bias circuit 701 may include another Zener diode and resistor in series with the Zener diode and resistor shown in FIG. 8, for providing bias voltage(s) to the low-side drive circuits 603 and 604. However, this is merely by way of example, as any suitable bias circuit may be used. FIG. 8 also illustrates an example of a timing circuit 702 realized as an RC circuit having a capacitor C1 and a resistor R1. Again, this is merely one example of a timing circuit, as other configurations of timing circuits may be used. Drive transistors 703A and 703B are shown as being realized by bipolar junction transistors. However, the techniques described herein are not limited in this respect, as the drive transistors may be realized by any type of transistors. Transistor circuits 605 and 606 are shown as MOSFETs, in this example. However, the transistor circuits 605 and 606 may be realized by any type of transistors. In some embodiments, transistor circuits 605 and/or 606 may have a plurality of transistors connected in parallel. As discussed above, switch circuitry S3 may be realized as a diode, as shown in FIG. 8. However, as discussed above, the techniques described herein are not limited in this respect, as in some embodiments switch circuitry S3 may be realized by a transistor.

Figure 9:
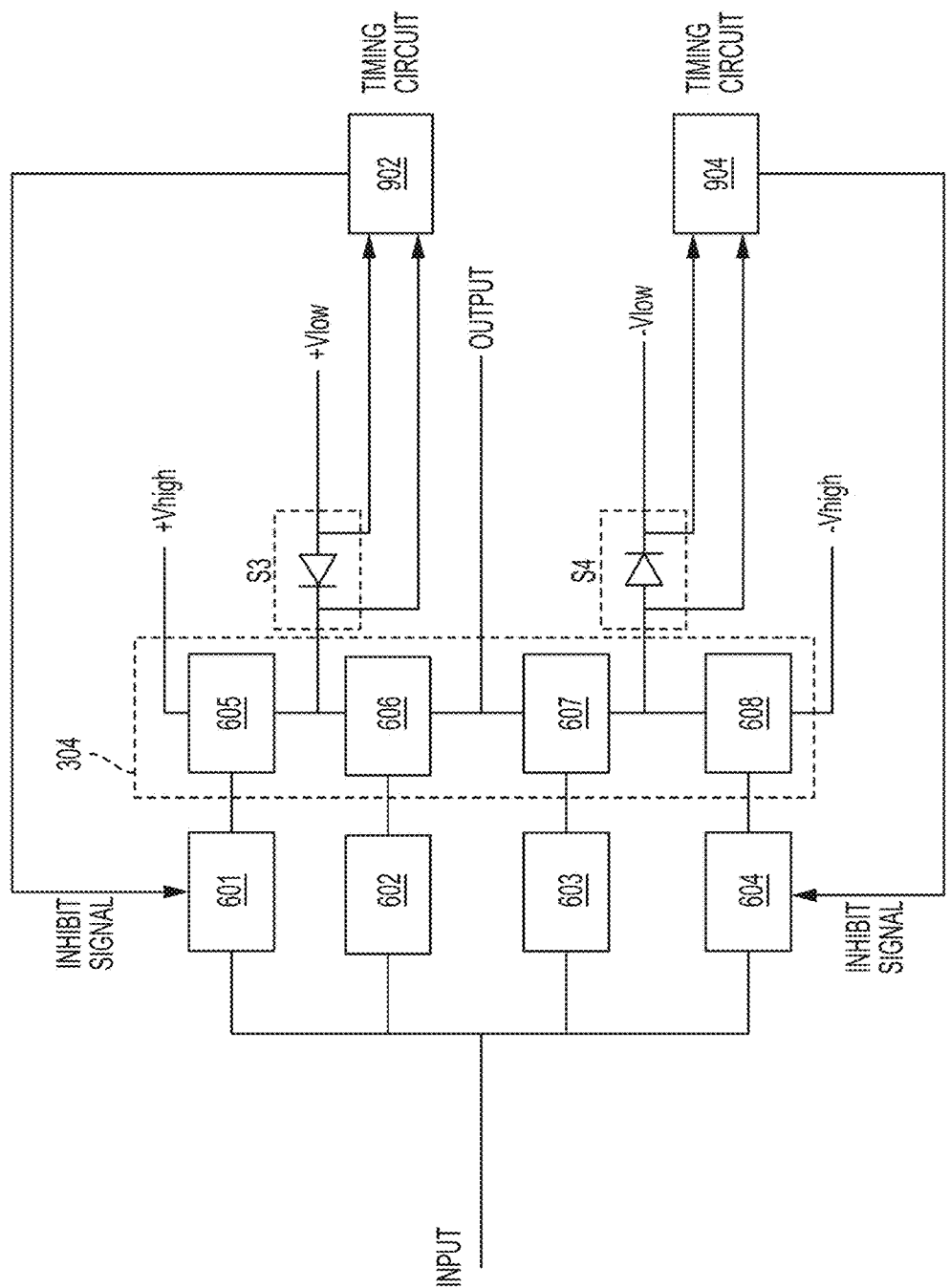
FIG. 9 shows another example of a technique for implementing a timing circuit, according to some embodiments.

FIG. 9 shows another example of a technique for implementing a timing circuit. The inventors have recognized and appreciated that if switch S3 is realized by a diode, the voltage across the diode can be used as a trigger for a timing circuit to limit the amount of time that transistor(s) 605 are turned on. When a low output voltage is produced by linear amplifier 304, the diode is forward biased and conducting. When the linear amplifier 304 produces a high output voltage, transistor(s) 605 turn on and the diode switches from being forward biased to being reverse biased. The reverse bias voltage can be sensed by timing circuit 902 as an indication that transistor(s) 605 are being turned on. In the example of FIG. 9, the voltage across the diode is provided as an input to timing circuit 902, which produces an inhibit signal to inhibit the operation of drive circuit 601 after a period of time, thereby limiting the amount of time that transistor(s) 605 are turned on. Timing circuit 904 may operate similarly in order to inhibit the operation of drive circuit 604 after transistor(s) 608 have been conducting for a period of time.

Figure 10:
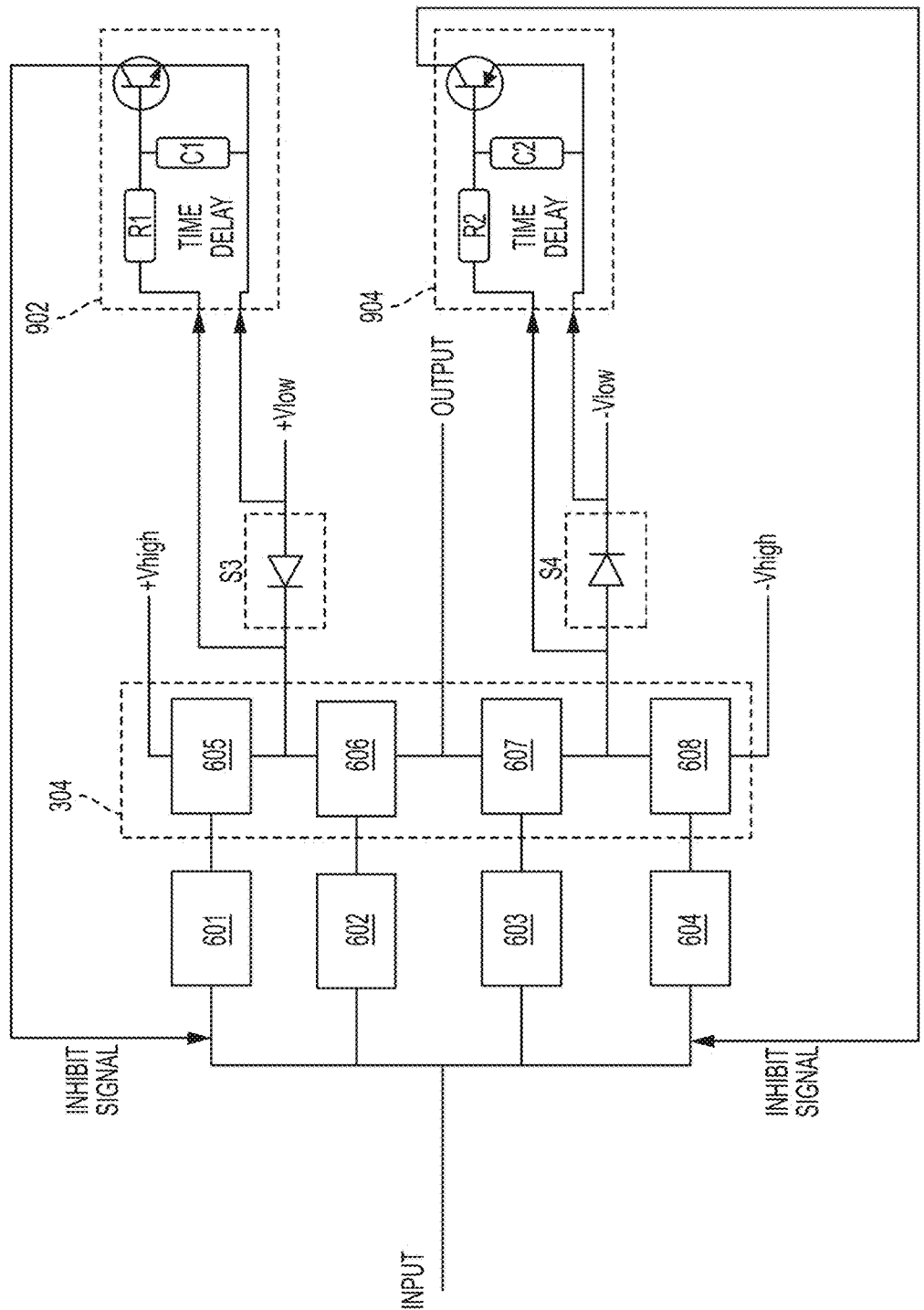
FIG. 10 shows an example of timing circuits realized by an RC circuit and a transistor, according to some embodiments.

FIG. 10 shows an example of timing circuits 902 and 904 realized by an RC circuit and a bipolar transistor. In timing circuit 902, for example, once the diode is reverse biased after a period of time the output of the RC circuit rises to a level where the bipolar transistor turns on. When the bipolar transistor turns on, the input of the drive circuit 601 is pulled down to +Vlow, which turns off the drive circuit 601 and transistor(s) 605.

Figure 11:
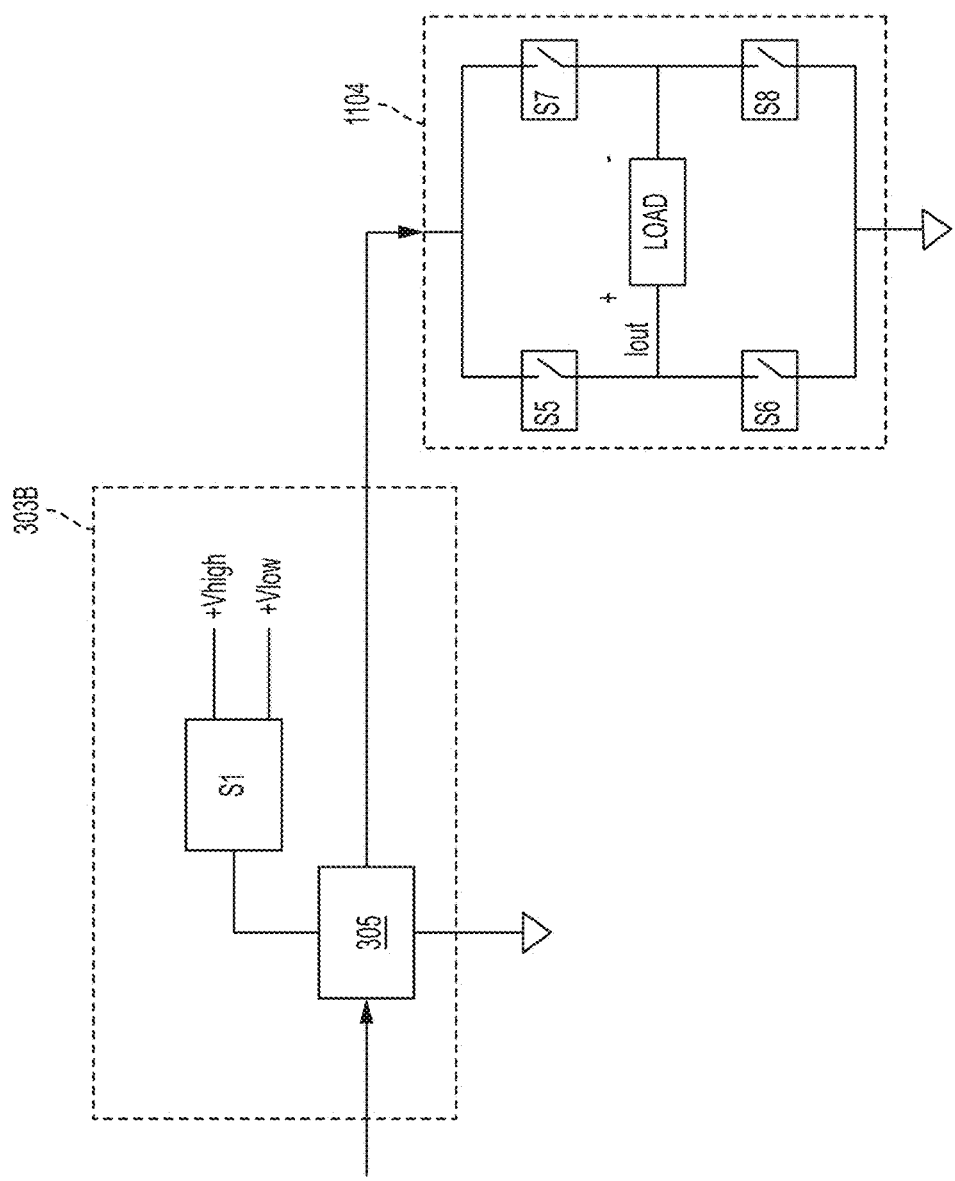
FIG. 11 shows an example of an output stage including a single-ended linear amplifier, according to some embodiments.

Although FIGS. 6, 9 and 10 show a "double-ended" linear amplifier 304 that may produce a positive output voltage or a negative output voltage, the techniques described herein are not limited in this respect, as in some embodiments a single-ended linear amplifier may be used. FIG. 11 shows an example of an output stage 303B including a single-ended linear amplifier 305 that produces only positive output voltages. FIG. 11 schematically illustrates that the single-ended linear amplifier 305 may be connected to a high positive voltage terminal +Vhigh or a low positive voltage terminal +Vlow by switch S1, depending on the output voltage to be produced. The output stage 303B may be implemented using the drive circuits 601, 602, transistor(s) 605 and 606, and associated switch circuit S3 discussed above, in some embodiments.

The output stage 303B may provide a positive output voltage or a negative output voltage to a load using a polarity-switching circuit 1104. In the example of FIG. 11, polarity-switching circuit 1104 is realized using an H-bridge including switches S5-S8. A positive voltage may be provided to the load by turning on switches S5 and S8 and turning off switches S6 and S7. A negative voltage may be provided to the load by turning on switches S6 and S7 and turning off switches S5 and S8. In some embodiments, the control circuit (not shown) may control switches S5-S8 to produce an output voltage of a suitable polarity. The polarity may be determined by examining the polarity of the current command, the error signal E, or any other suitable signal.

Figure 12:
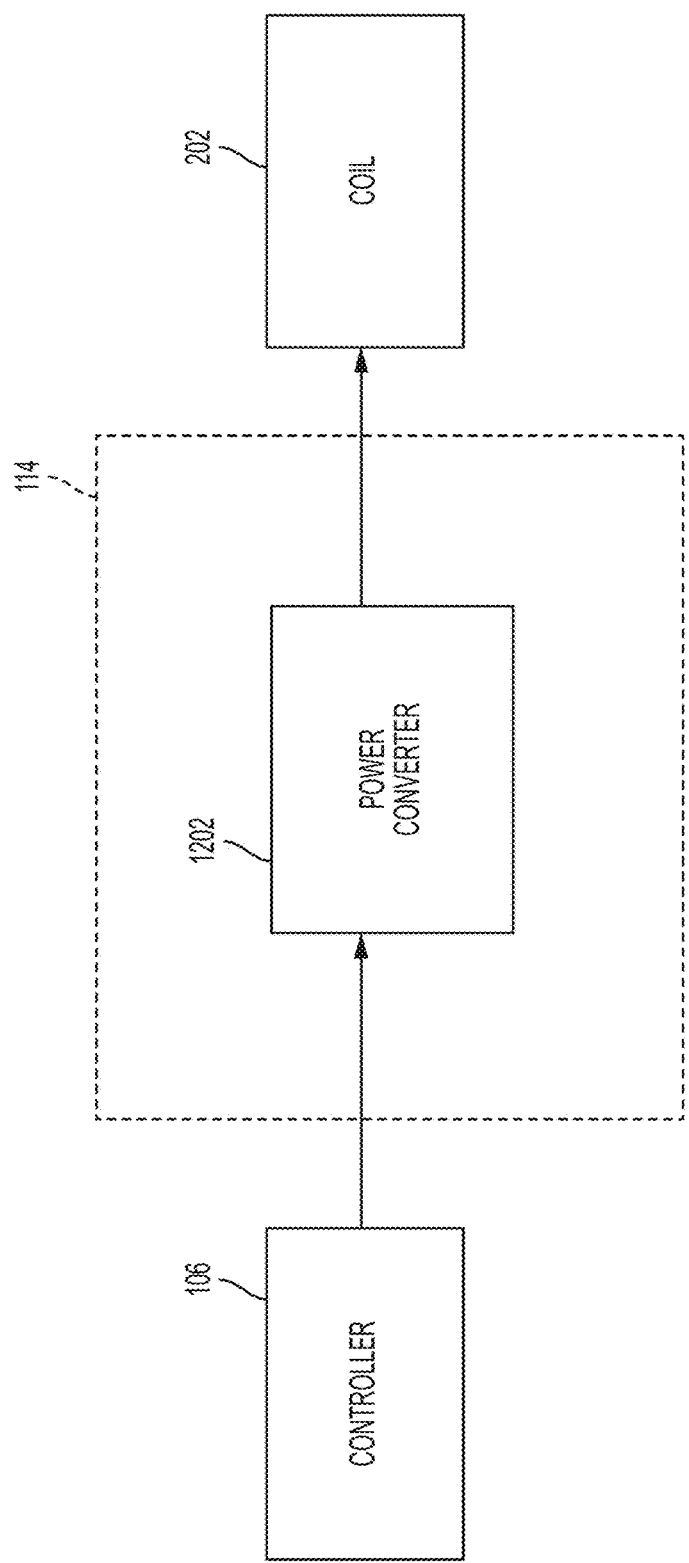
FIG. 12 shows an example of a power component may include a switching power converter, according to some embodiments.

As discussed above, conventional switching converters can introduce a significant amount of switching noise into the system because they switch at frequencies in the range of tens to hundreds of kHz. Such switching noise can interfere with imaging because it is in the same frequency range as MR signals desired to be detected. The inventors have recognized that a power converter having a switching frequency above the Larmor frequency of interest does not interfere with imaging to a significant degree. Accordingly, in some embodiments, power component 114 may include a switching power converter 1202 that is designed to switch at a relatively high switching frequency, above the Larmor frequency of interest, as shown in FIG. 12. In some embodiments, the switching frequency may be higher than 1 MHz, higher than 10 MHz, higher 30 MHz or higher than 300 MHz.

As discussed above, the inventors have appreciated that providing variable voltage supply terminals facilitates efficient powering of one or more gradient coils of a magnetic resonance imaging system (e.g., a low-field MRI system). In some embodiments, the output stage may be powered by one or more or more variable voltage supply terminals that are controlled to produce supply voltages close to the desired output voltage. Providing such a variable voltage supply terminal can improve the efficiency of the output stage by limiting the voltage drop across the linear amplifier.

Figure 13:
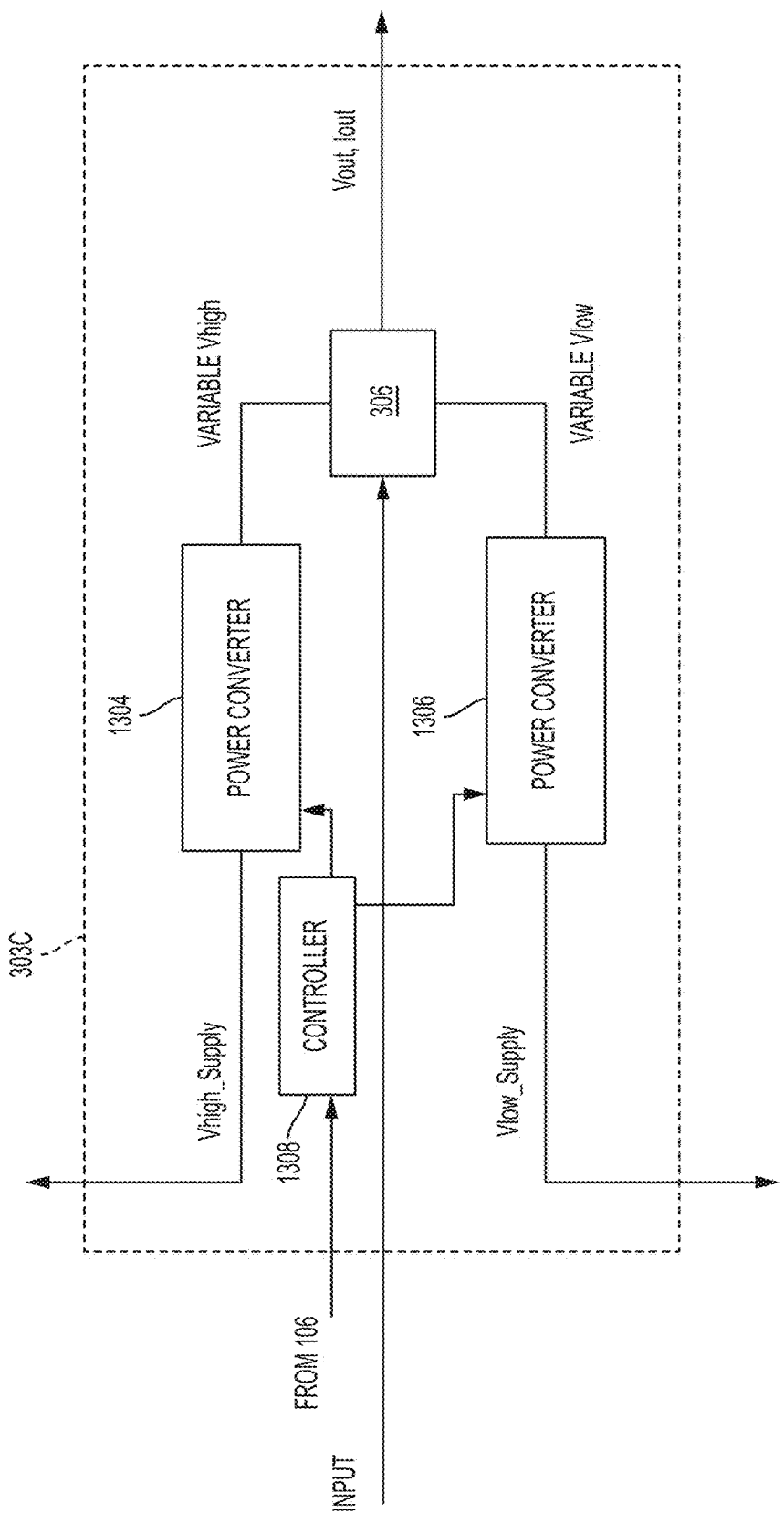
FIG. 13 shows an embodiment of an output stage that may be powered by a variable voltage positive supply terminal and a variable voltage negative supply terminal, according to some embodiments.

FIG. 13 shows an embodiment of an output stage 303C that may be powered by a variable voltage positive supply terminal and a variable voltage negative supply terminal. The voltages of the supply terminals can be varied depending on the output voltage to reduce the voltage drop across the transistor(s) of the linear amplifier 306, thus facilitating efficient powering of gradient coil(s) to produce magnetic fields according to a desired pulse sequence. In some embodiments, the voltage of the positive voltage terminal and/or the negative voltage terminal may be provided by power converters 1304 and/or 1306, respectively. The variable output voltages of the power converters 1304 and/or 1306 may be controlled by a controller 1308 based on the desired output voltage of output stage 303C to maintain the voltages of the positive voltage terminal and/or the negative voltage terminal slightly above (or below, respectively) the output voltage of the output stage, thereby reducing the voltage drop across the transistor(s) of the linear amplifier.

According to some embodiments, controller 1308 controls the variable output voltages of the power converters 1304 and/or 1306 based on the output voltage of linear amplifier 306. However, the variable output voltages may be controlled in other ways and/or in different relationship to the desired output voltage of output stage 303C. For example, the variable output voltages may be controlled based on the command (e.g., current command) provided to linear amplifier 306. As discussed in the foregoing, a controller may be configured to command the linear amplifier to produce output sufficient to drive one or more gradient coils of a magnetic resonance imaging system in accordance with a desired pulse sequence. As such, controller 1308 may be configured to control the variable output voltages of the power converters 1304 and/or 1306 so that the output voltages provided to the linear amplifier are sufficient, without being too excessive and therefore inefficient, to allow the linear amplifier to produce output to power the one or more gradient coils in accordance with the desired pulse sequence. Control of the power converters 1304 and 1306 may be performed in any suitable way, such as by controlling their duty ratio, their frequency, or any other control parameter that can control the output voltage of the power converters. In some embodiments, power converters 1304 and 1306 of FIG. 13 may be switching power converters designed to switch at a relatively high switching frequency, above the Larmor frequency of interest, as discussed above. However, any suitable power converter may be used, as the aspects are not limited in this respect.

Figure 14A:
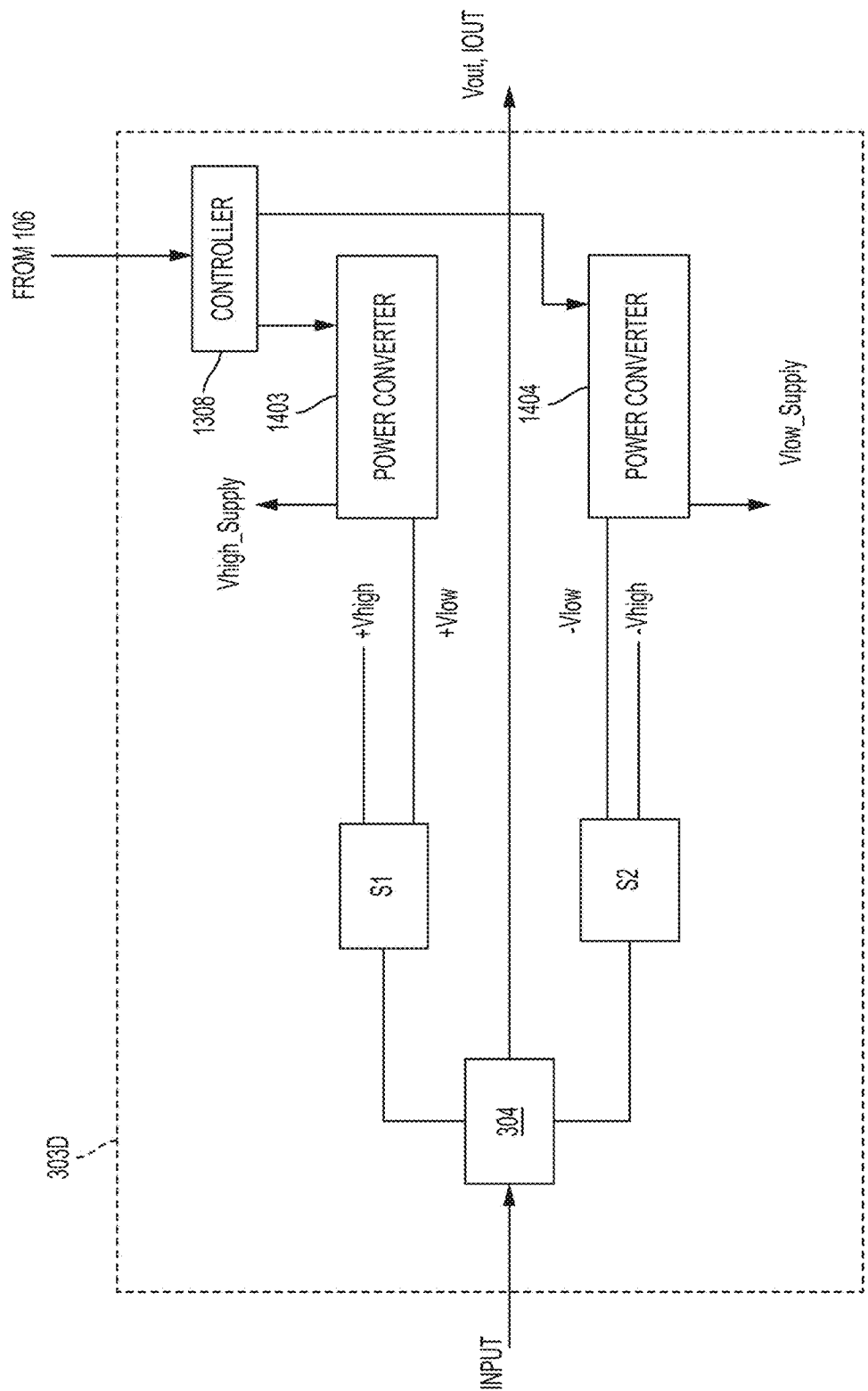
FIG. 14A shows an embodiment similar to that of FIG. 5A with variable low voltage supply terminals.

In some embodiments, both high and low voltage supply terminals (e.g., +Vhigh and +Vlow) may power the linear amplifier, as illustrated in FIGS. 5, 6, and 11, and the voltage of the low voltage supply terminal, the high voltage supply terminal, both, or any supply terminal provided may be variable. FIG. 14A shows an embodiment of an output stage 303D similar to FIG. 5A with variable low voltage supply terminals. Rather than having low voltage terminals +Vlow and −Vlow at fixed voltages, FIG. 14A shows that +Vlow and −Vlow can have variable voltages. In some embodiments, the variable voltages of +Vlow and −Vlow may be provided by power converters 1403 and 1404, respectively. In some embodiments, power converters 1403 and 1404 may be switching power converters designed to switch at a relatively high switching frequency, above the Larmor frequency of interest, as discussed above. When a relatively low output voltage is to be produced (e.g., in the steady state), current is sourced from the low voltage supply terminals +Vlow or −Vlow. The output voltages +Vlow or −Vlow of the power converters 1403 or 1404 may be controlled by controller 1308 based on the desired output voltage Vout of linear amplifier 304 to maintain the voltages of the low voltage supply terminals +Vlow or −Vlow slightly above (or below, respectively) the output voltage of the output stage, thereby reducing the voltage drop across the transistor(s) of the linear amplifier in the steady state and reducing power dissipation. When a relatively high output voltage is to be produced, current may be sourced from the high voltage terminals +Vhigh or +Vlow, which may have fixed voltages.

Figure 14B:
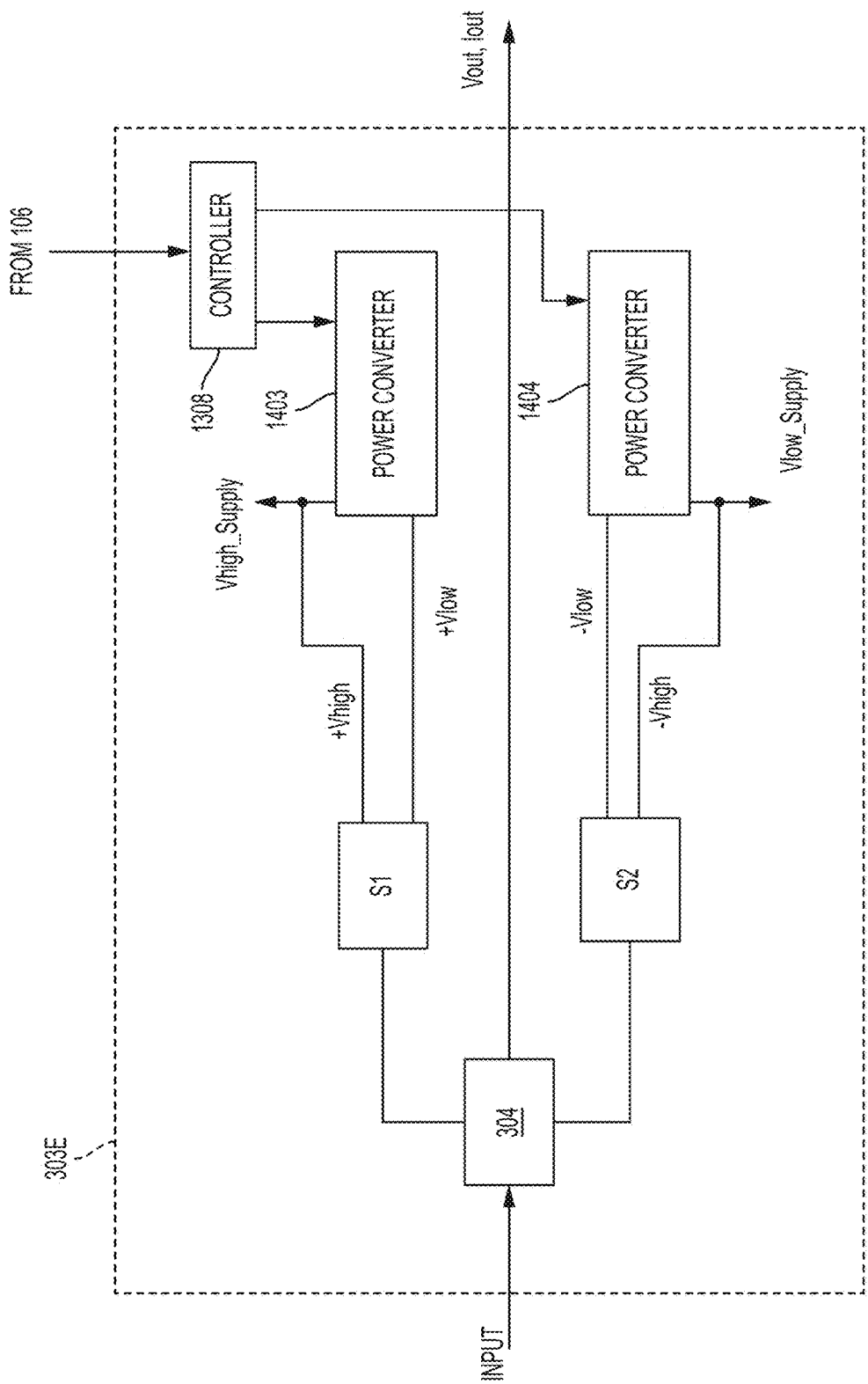
FIG. 14B shows an embodiment in which the high voltage supply terminals are the same as the power supply terminals that supply power to the power converters.

+Vhigh may be a separate terminal from the power supply terminal Vhigh_Supply that supplies power to power converter 1403, as illustrated in FIG. 14A, or may be the same terminal as Vhigh_Supply, as illustrated in FIG. 14B. In FIG. 14B, an example is shown of an output stage 303E in which +Vhigh is provided from the power supply terminal Vhigh_Supply and −Vhigh is provided from the power supply terminal Vlow_Supply that provides power to power converter 1404. Providing +Vhigh and/or −Vhigh from the existing power supply terminals can avoid the need to produce additional power supply voltages, which can simplify the design and implementation of the output stage.

FIG. 15A shows an example of a gradient coil current waveform, according to some embodiments. The gradient coil current is initially zero, then rapidly ramps up to 10 A in 0.1 ms. The current remains at 10 A for a period of time, then drops back to 0 A. The current remains at 0 A for a period of time before rapidly ramping up to 20 A in 0.2 ms. The current remains at 20 A for a period of time, then drops back to 0 A. It should be appreciated that the amp values and time intervals are merely exemplary for the purposes of illustration, and any suitable values may be used.

FIG. 15B shows the rising transition of the gradient coil current from 0 A to 10 A, the voltage 1502 needed for driving the gradient coil, the voltage of the high voltage supply terminal +Vhigh and the low voltage supply terminal +Vlow. During the transition, current is sourced from the high voltage supply terminal +Vhigh in order to provide a high voltage to the gradient coil to quickly ramp up its current. As the transition occurs, the power converter 1403 begins to ramp up the voltage of the low voltage supply terminal +Vlow from ~0V to a voltage slightly higher than the output voltage necessary to drive the gradient coil with a steady state current of 10 A. Once the steady state current of 10 A is reached, current is sourced from the low voltage supply terminal +Vlow in order to provide high efficiency in the steady state.

FIG. 15C shows the rising transition of the gradient coil current from 0 A to 20 A, the gradient coil voltage, and the voltage of the high voltage supply terminal +Vhigh and the low voltage supply terminal +Vlow. During the transition to 20 A, as with the transition to 10 A, current is sourced from the high voltage supply terminal +Vhigh in order to provide a high voltage to the gradient coil to quickly ramp up its current. As the transition occurs, the power converter 1403 begins to ramp up the voltage of the low voltage supply terminal +Vlow from ~0V to a voltage slightly higher than the output voltage necessary to drive the gradient coil with a steady state current of 20 A. Once the steady state current of 20 A is reached, current is sourced from the low voltage supply terminal +Vlow.

Since the voltage of the low voltage supply terminal +Vlow can be varied, it can be set slightly above the output voltage needed for different steady state current levels. This can improve the efficiency over the case of using a low voltage supply terminal +Vlow having a fixed voltage, as a fixed voltage would need to be designed to handle the maximum steady state current, which may be a higher voltage than necessary for driving lower steady state currents, which can decrease efficiency. As an example, if the +Vlow is set high enough to supply a 20 A steady state gradient coil current, such a voltage is higher than necessary to supply a 10 A steady state gradient coil current, which results in increased voltage drop across the linear amplifier transistor(s) when supplying a 10 A steady state gradient coil current, and higher power dissipation occurs than is necessary. A variable voltage can be set at or near the minimum voltage necessary to supply the commanded steady state gradient coil current, which improves efficiency.

Figure 15D:
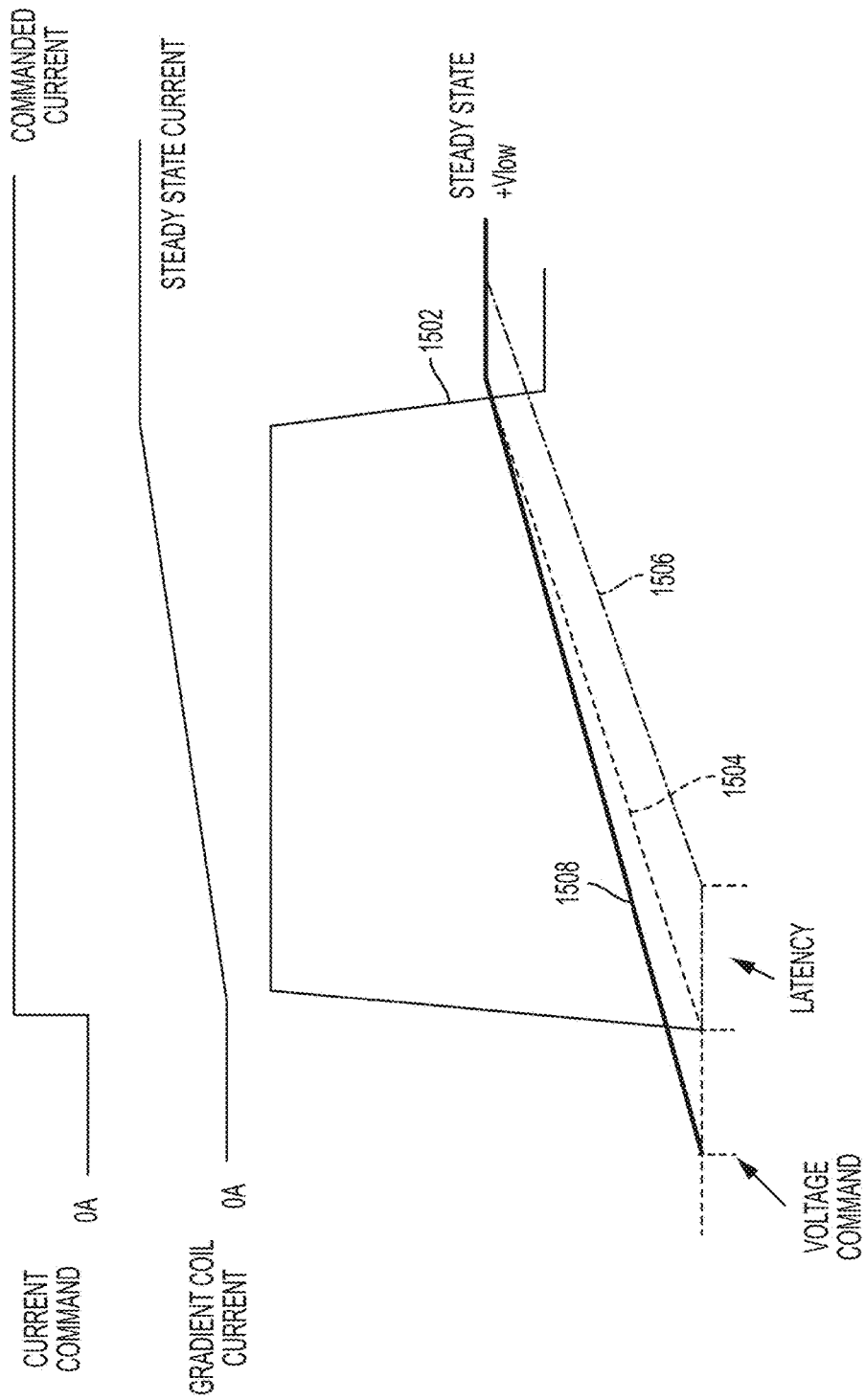

FIG. 15D shows a current command, gradient coil current, the voltage 1502 of the gradient coil needed to supply the current, and several different transition waveforms of the voltage +Vlow. Transition waveform 1504 shows an idealized transition in which the voltage of +Vlow starts ramping up in response to the rising edge of the gradient coil current command, and reaches the steady state value of +Vlow at the same time that the steady state gradient coil current (and voltage values) are reached. However, the inventors have recognized and appreciated that there may be factors preventing the voltage +Vlow from reaching a sufficient voltage level in time for the terminal +Vlow to supply the steady state current. Transition waveform 1506 shows a more realistic transition of +Vlow, which has a period of latency (delay) in responding to the gradient coil current command. As shown in FIG. 15D, the transition waveform 1506 starts ramping up only after a period of time following the rising edge of the current command. The slope of the transition waveform 1506 may be limited, as the power converter 1403 may have an output filter (e.g., a capacitor) that limits the speed with which power converter 1403 can change the voltage of +Vlow. As a result, the transition waveform 1506 may not reach a sufficient voltage level by the time the steady state gradient coil current and voltage are reached, which may result in the low voltage supply terminal +Vlow being unable to supply the steady state current, at least temporarily.

To address this, in some embodiments, the power converter 1403 (or 1404) may begin ramping up the magnitude of the voltage of +Vlow (or −Vlow) before the rising edge of the gradient coil current command. FIG. 15D shows a transition waveform 1508 for +Vlow that starts ramping up before the rising edge of the gradient coil current command. To begin the transition prior to the rising edge of the gradient coil current command, controller 1308 may receive information from controller 106 regarding an upcoming gradient coil current pulse, and begin ramping up the magnitude of the voltage of +Vlow (or −Vlow) in anticipation of the current pulse. This information may be provided from controller 106 to controller 1308 in any suitable way. As an example, the controller 106 may analyze the currently selected gradient coil pulse sequence, determine a power supply voltage level suitable to supply the steady state gradient coil current for the next current pulse, and send a voltage command to controller 1308 in advance of an anticipated current command. The power converter 1403 (or 1404) may then respond to the received voltage command and begin ramping +Vlow (or −Vlow) to the commanded voltage value. As another example of providing the information to the controller 1308, the controller 106 may send the currently selected pulse sequence or a portion of the pulse sequence to controller 1308. Controller 1308 may then analyze the pulse sequence and send commands to the power converter 1403 (or 1404) to start ramping the voltage +Vlow (or −Vlow) in advance of a gradient coil current pulse. In the example of FIG. 15D, the power converter 1403 starts ramping up the voltage of +Vlow in response to a voltage command provided by controller 106 to controller 1308 in advance of the rising edge of the current command As a result, the transition waveform 1508 reaches the level of +Vlow sufficient to supply the steady state current by the time the steady state current level is reached.

Figure 16A:
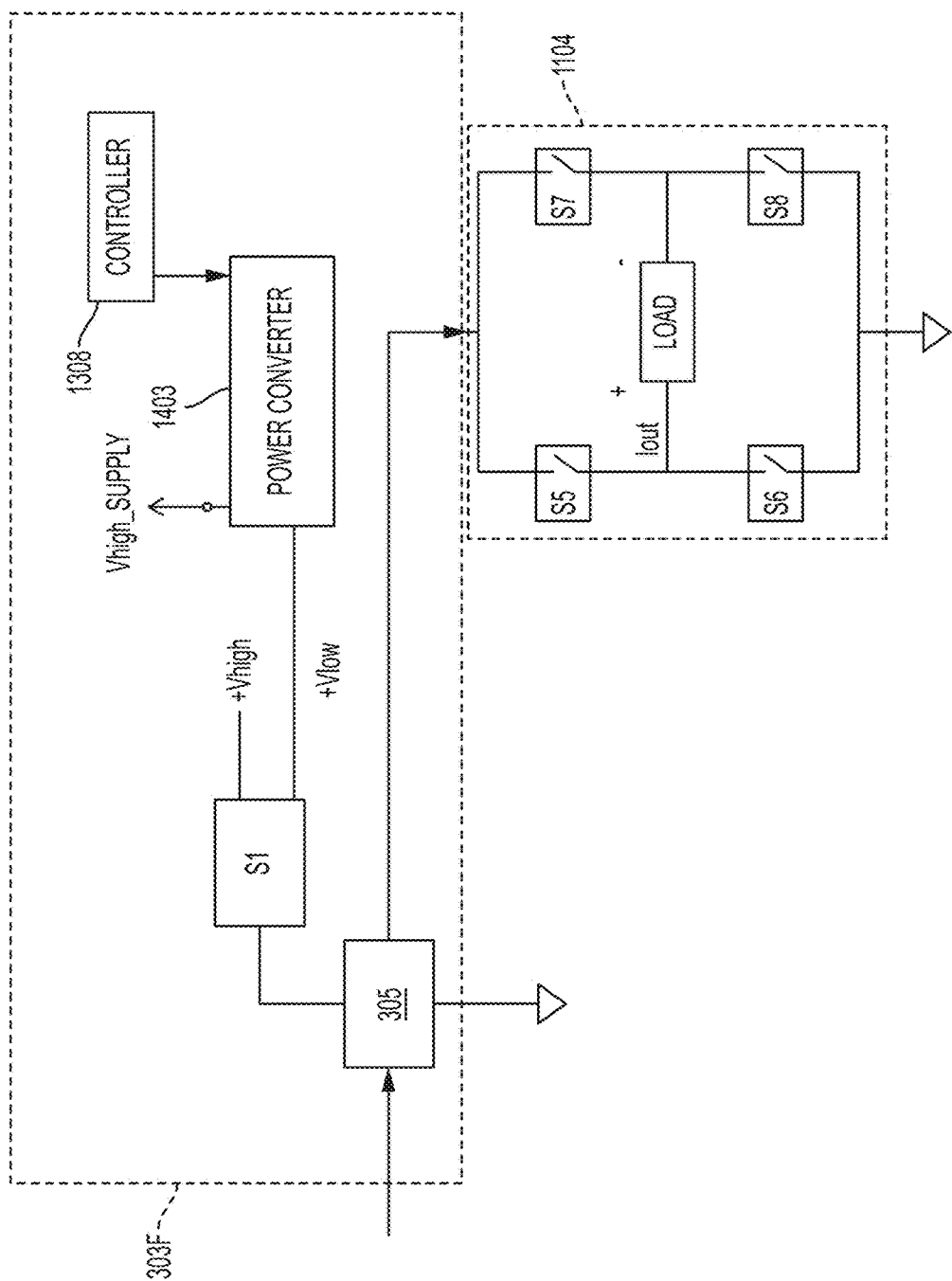
FIG. 16A shows an embodiment similar to that of FIG. 11 with a variable low voltage supply terminal.

FIG. 16A shows an embodiment of an output stage 303F with a single-ended linear amplifier similar to that of FIG. 11, with a variable low voltage supply terminal +Vlow. As with the embodiment of FIG. 14A, the power converter 1403 supplies a variable voltage to the low voltage supply terminal +Vlow that can be set slightly above the voltage needed to supply the commanded steady state gradient coil current.

Figure 16B:
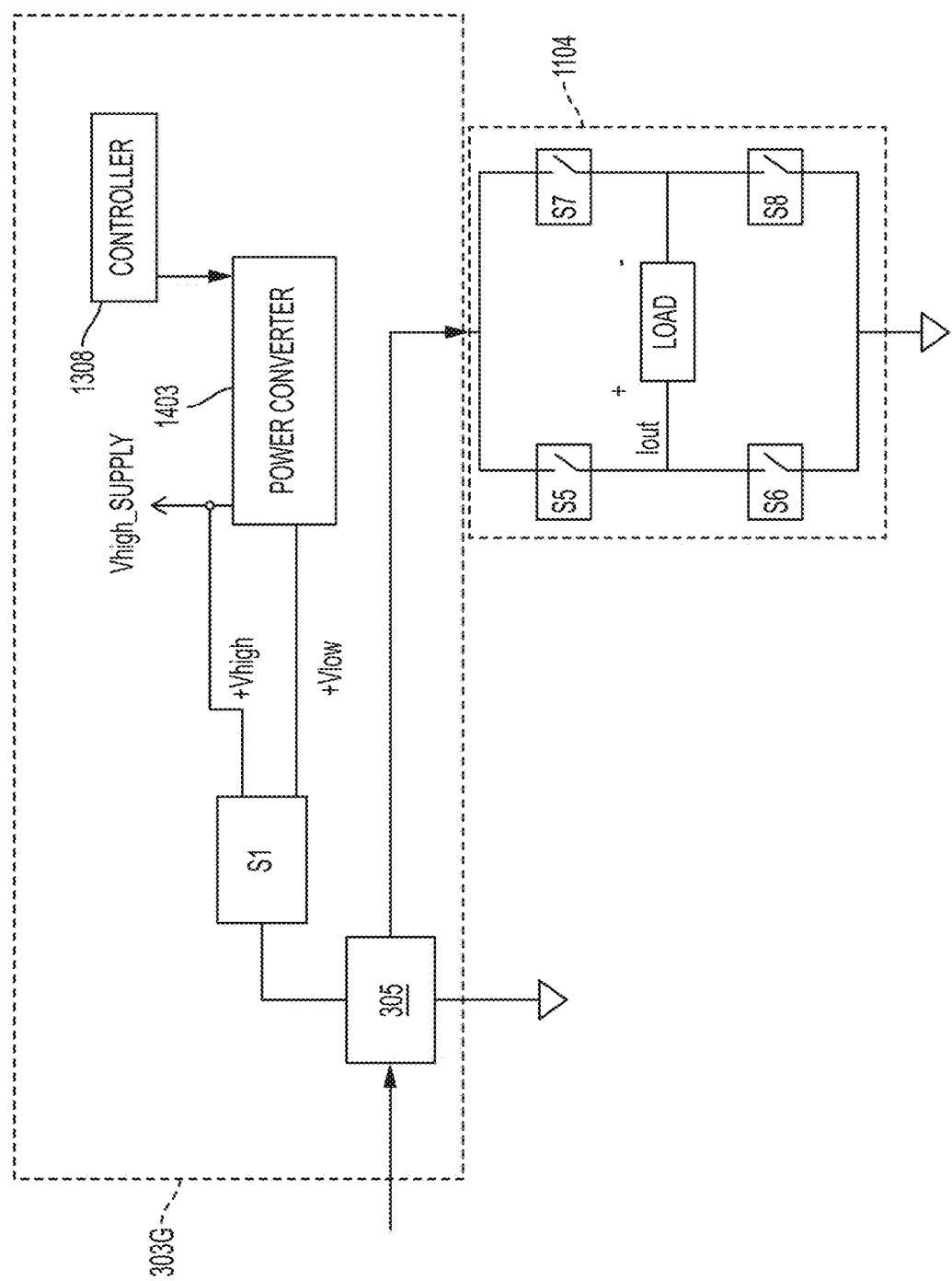
FIG. 16B shows an embodiment in which the high voltage supply terminal is the same as the power supply terminal that supplies power to the power converter.

As discussed above in connection with FIG. 14A and FIG. 14B, the high voltage supply terminal +Vhigh may be a separate terminal from the power supply terminal Vhigh_Supply, as illustrated in FIG. 16A, or may be the same terminal as Vhigh_Supply, as illustrated in FIG. 16B. In FIG. 16B, an example of an output stage 303G is shown in which +Vhigh is provided from the power supply terminal Vhigh_Supply. Providing the voltage +Vhigh from the existing power supply terminal Vhigh_Supply can avoid the need to produce additional power supply voltages, which can simplify the design and implementation of the output stage.

In some embodiments, both the low voltage supply terminal(s) and the high voltage supply terminal(s) may have variable voltages. For example, the embodiments of FIG. 14 or 11 may be modified such that the high voltage supply terminals +Vhigh and/or −Vhigh are variable voltages produced by power converters. Such power converters may be similar to power converters 1403 and 1404, and may be controlled by the controller 1308, as well. Such an embodiment can be used for any suitable type of imaging, and may be particularly useful for diffusion weighted imaging, for example, where relatively large currents may be needed (e.g., 40 A, 50 A, 70 A, 90 A or more, or any values there between).

In some embodiments, one or more additional power supply terminals may power the linear amplifier. For example, a third power supply terminal may be provided that has a voltage higher than the high voltage supply terminal +Vhigh (e.g., at least 5 times higher or at least 10 times higher, and even as high as 20 or 30 times higher or more, or in any range between such values). Adding a third supply terminal may help improve efficiency in the case where a wide range of voltages need to be produced. Any number of power supply terminals may be provided, as the techniques described herein are not limited in this respect.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus for powering at least one gradient coil of a magnetic resonance imaging system, the apparatus comprising:
   a switching power converter configured to switch at a switching frequency above a Larmor frequency associated with a $B_0$ field strength of the magnetic resonance imaging system; and
   a controller configured to control the switching power converter to drive the at least one gradient coil in accordance with a pulse sequence.

2. The apparatus of claim 1, wherein the $B_0$ field strength is equal to or less than approximately 0.2 T and greater than or equal to approximately 0.1 T.

3. The apparatus of claim 1, wherein the $B_0$ field strength is equal to or less than approximately 0.1 T and greater than or equal to approximately 50 mT.

4. The apparatus of claim 1, wherein the $B_0$ field strength is equal to or less than approximately 50 mT and greater than or equal to approximately 20 mT.

5. The apparatus of claim 1, wherein the $B_0$ field strength is equal to or less than approximately 20 mT and greater than or equal to approximately 10 mT.

6. The apparatus of claim 1, wherein the switching frequency is greater than 1 MHz and less than 10 MHz.

7. The apparatus of claim 1, wherein the switching frequency is greater than 10 MHz and less than 30 MHz.

8. The apparatus of claim 1, wherein the switching frequency is greater than 30 MHz and less than 300 MHz.

9. The apparatus of claim 1, wherein the switching frequency is greater than 300 MHz.

10. The apparatus of claim 1, wherein the at least one gradient coil comprises at least one first gradient coil, at least one second gradient coil and at least one third gradient coil to provide spatial encoding in three-dimensions, and wherein the at least one power component is configured to provide power to the at least one first gradient coil, the at least one second gradient coil and the at least one third gradient coil.

11. The apparatus of claim 1, wherein the switching power converter is configured to produce variable output voltages, and wherein the controller is configure to control the variable output voltages provided by the switching power converter.

12. A method of powering at least one gradient coil of a magnetic resonance imaging system, the method comprising:
   controlling a switching power converter configured to switch at a switching frequency above a Larmor frequency associated with a $B_0$ field strength of the magnetic resonance imaging system to power the at least one gradient coil in accordance with a pulse sequence.

13. The method of claim 12, wherein controlling the switching power converter comprises controlling the power converter to switch at a switching frequency greater than 1 MHz and less than 10 MHz.

14. The method of claim 12, wherein controlling the switching power converter comprises controlling the power converter to switch at a switching frequency greater than 10 MHz and less than 30 MHz.

15. The method of claim 12, wherein controlling the switching power converter comprises controlling the power converter to switch at a switching frequency greater than 30 MHz and less than 300 MHz.

16. The method of claim 12, wherein controlling the switching power converter comprises controlling the power converter to switch at a switching frequency greater than 300 MHz.

17. The method of claim 12, wherein the controlling the switching power converter comprises controlling the switching power converter to produce variable output voltages.

18. A magnetic resonance imaging system comprising:
 a B0 magnet configured to produce a B0 magnetic field;
 at least one gradient coil; and
 at least one power component configured to provide power to operate the at least one gradient coil, the at least one power component comprising:
  a switching power converter configured to switch at a switching frequency above a Larmor frequency associated with a $B_0$ field strength of the magnetic resonance imaging system; and
  a controller configured to control the switching power converter to drive the at least one gradient coil in accordance with a pulse sequence.

19. The magnetic resonance imaging system of claim 18, wherein the B0 magnet, when operated, is configured to produce a B0 magnetic field having a field strength equal to or less than approximately 0.2 T and greater than or equal to approximately 0.1 T.

20. The magnetic resonance imaging system of claim 18, wherein the B0 magnet, when operated, is configured to produce a B0 magnetic field having a field strength equal to or less than approximately 0.1 T and greater than or equal to approximately 50 mT.

21. The magnetic resonance imaging system of claim 18, wherein the B0 magnet, when operated, is configured to produce a B0 magnetic field having a field strength equal to or less than approximately 50 mT and greater than or equal to approximately 20 mT.

22. The magnetic resonance imaging system of claim 18, wherein the B0 magnet, when operated, is configured to produce a B0 magnetic field having a field strength equal to or less than approximately 20 mT and greater than or equal to approximately 10 mT.

23. The magnetic resonance imaging system of claim 18, wherein the switching frequency is greater than 1 MHz and less than 10 MHz.

24. The magnetic resonance imaging system of claim 18, wherein the switching frequency is greater than 10 MHz and less than 30 MHz.

25. The magnetic resonance imaging system of claim 18, wherein the switching frequency is greater than 30 MHz and less than 300 MHz.

26. The magnetic resonance imaging system of claim 18, wherein the switching frequency is greater than 300 MHz.

27. The magnetic resonance imaging system of claim 18, wherein the at least one gradient coil comprises at least one first gradient coil, at least one second gradient coil and at least one third gradient coil to provide encoding in three-dimensions, and wherein the at least one power component is configured to provide power to the at least one first gradient coil, the at least one second gradient coil and the at least one third gradient coil.

28. The magnetic resonance imaging system of claim 18, wherein the switching power converter is configured to produce variable output voltages, and wherein the controller is configure to control the variable output voltages provided by the switching power converter.

* * * * *